United States Patent
Gegner et al.

(10) Patent No.: US 6,552,448 B1
(45) Date of Patent: Apr. 22, 2003

(54) ENERGY MANAGEMENT SYSTEM FOR SERIES CONNECTED AMPLIFIERS

(75) Inventors: Joel P. Gegner, Goshen, IN (US); Gerald R. Stanley, Osceola, IN (US)

(73) Assignee: Harman International Industries, Incorporated, Northridge, CA (US)

(*) Notice: Subject to any disclaimer, the term of this patent is extended or adjusted under 35 U.S.C. 154(b) by 152 days.

(21) Appl. No.: 09/657,827

(22) Filed: Sep. 8, 2000

Related U.S. Application Data

(60) Provisional application No. 60/152,757, filed on Sep. 8, 1999.

(51) Int. Cl.[7] .................................................. H02J 1/00
(52) U.S. Cl. ............................. 307/77; 307/54; 307/63
(58) Field of Search .............................. 307/77, 54, 61, 307/63

(56) References Cited

U.S. PATENT DOCUMENTS

| | | | |
|---|---|---|---|
| 3,787,730 A | * 1/1974 | Ray et al. ..................... 307/77 |
| 4,668,904 A | 5/1987 | Kupiainen | |
| 4,733,342 A | 3/1988 | Mueller et al. | |
| 4,794,338 A | * 12/1988 | Roemer et al. .............. 324/39 |
| 4,820,986 A | 4/1989 | Mansfield et al. | |
| 4,961,054 A | 10/1990 | Park et al. | |
| 5,017,871 A | 5/1991 | Mueller et al. | |
| 5,063,349 A | 11/1991 | Roemer et al. | |
| 5,066,914 A | * 11/1991 | Vavrek et al. ............. 324/309 |
| 5,079,503 A | 1/1992 | Siebold et al. | |
| 5,087,880 A | 2/1992 | Bruder et al. | |
| 5,105,153 A | 4/1992 | Mueller et al. | |
| 5,245,287 A | 9/1993 | Nowak et al. | |
| 5,270,657 A | 12/1993 | Wirth et al. | |
| 5,298,863 A | 3/1994 | Nowak et al. | |
| 5,451,878 A | 9/1995 | Wirth et al. | |
| 5,617,030 A | 4/1997 | Fischer et al. | |
| 5,701,076 A | 12/1997 | Schmitt et al. | |
| 6,201,395 B1 | * 3/2001 | Stanley ....................... 324/322 |

* cited by examiner

*Primary Examiner*—Fritz Fleming

(57) ABSTRACT

An energy management controller (EMC) for use with series connected amplifier modules monitors the rail voltage across an energy storage capacitor which drives the amplifier modules, and compares the rail voltage with a reference voltage. The EMC controls the direction of energy flow to either provide power to one of the amplifier modules to add energy to the energy storage capacitor, or to provide power to the load.

40 Claims, 24 Drawing Sheets

ENERGY MANAGEMENT SYSTEM FOR SERIES CONNECTED AMPLIFIERS

This application claims the benefit of No. 60/152,757 filed Sep. 8, 1999.

FIELD OF THE INVENTION

This invention generally relates to gradient amplifier systems and more particularly to a system for managing the movement of energy within a high voltage gradient amplifier system for powering the gradient coils of a magnetic resonance imaging (MRI) apparatus.

BACKGROUND OF THE INVENTION

The demands of the MRI market have continuously required faster gradient fields. These spatially varying magnetic fields are produced by large coils, which are driven by gradient waveforms produced by a gradient amplifier system (GAS). The GAS is capable of high current and high voltage. The high current enables greater Gauss per centimeter gradient fields, while the high voltage enables faster gradient field slew rates.

Over the past decade, a number of imaging sequences have been developed which require unconventional gradient waveforms. The conventional waveforms have been primarily trapezoidal in nature, with fast linear ramps followed by extended plateaus. These waveforms require a large peak voltage to average voltage magnitude ratio, and can therefore be supplied by a GAS which inefficiently produces large output voltages, but efficiently produces moderate output voltages.

Some of the more recently developed imaging techniques, such as spiral scanning and diffusion weighted imaging, require not only high peak currents, high RMS currents, and high duty cycle, but also continuous slewing of the gradient field. Consequently, a GAS is required which can produce large peak and RMS voltages along with large peak and RMS currents. The increased demand for high RMS and peak voltage gives rise to the need for a GAS design with improved efficiency.

One way to address the increased peak voltage demands of the recently developed imaging techniques is to design a GAS with amplifiers connected in series, each having an expensive power supply. Another technique is to employ booster amplifiers and reclaim a portion of the power according to techniques commonly known in the art.

However, present generation booster amplifiers are too inefficient to operate continuously in a switching mode. Thus, these conventional booster amplifiers can be regenerated or re-charged only at the beginning and the end of a current pulse. Special pulses may be provided in the imaging sequence solely for the purpose of enabling this regeneration. This, however, increases the cost of programming and operating the GAS.

SUMMARY OF THE INVENTION

The present invention provides a high voltage GAS for powering gradient coils in an MRI system. The GAS is capable of economically and efficiently providing current slew rates of arbitrary form and duration by controlling the operation of series connected amplifier modules and managing regeneration of the amplifier modules depending upon the characteristics of the output waveforms.

Each amplifier module provides only a portion of the system voltage output, but is rated at the overall system current. The amplifier modules may themselves be made up of a plurality of paralleled amplifier stages. By appropriately altering the output voltage and current of each of the series connected amplifier modules, the power required by all but one of the amplifier modules may be reduced to zero during times of non-quiescent load current. During quiescent loading, small bias supplies are sufficient to support the internal quiescent losses of these floating amplifier modules (FAMs).

The small bias supplies may be either isolated, or boot strapped. Either implementation yields a significant reduction in power supply complexity and cost. Only one amplifier module (the ground-referenced-amplifier module (GAM)) requires a large power supply, which may be a split rail, ground-referenced, non-isolated power supply. In addition, this power supply does not need to be highly regulated. In fact, this supply can be little more than a rectifier with current interrupting capability, thereby further reducing the cost of the power supply.

In an MRI apparatus, three gradient coils are typically present, one for each of the spatial axes. The three GAMs corresponding to the three axes can therefore all be powered by the same non-isolated power supply. The end result is a three axes GAS that is economical, yet has high voltage and arbitrary gradient current slew rate capability.

The FAMs of each axis need only small power supplies because they receive power from the GAM. Since all of the amplifier modules conduct the same current, power can be transferred from the GAM to the FAMs by increasing the GAM's output voltage and decreasing the voltage across the FAMs by an equal amount when positive currents flow to the load. The voltage polarities are reversed for negative load currents. Since the GAM voltage and the FAM voltages are equal in magnitude and opposite in polarity, they cancel at the load. Accordingly, very fast error corrections can be made without inducing distortion into the load loop.

The voltage that must appear at the load depends upon the gradient command signal, which in turns depends upon the desired gradient waveform. Thus, the load voltage is a dependent variable. Consequently, the voltage alterations at the output of the GAM may reduce the summed voltage alterations of the FAMs. In addition, the controller that alters the output voltage of the FAMs and the GAM, the Energy Management Controller (EMC), will ultimately produce current dependent degeneracy and current dependent regeneracy, respectively, because power must flow from the GAM to the FAMs where it is dissipated.

One embodiment of the EMC results in a zero-sum perturbation to the load, meaning that as the voltage is increased in one amplifier module, it is decreased by the same amount in another module such that the load never perceives a voltage change. With a zero-sum configuration, the EMC can produce signals which are non-linear and non-stationary, greatly enhancing the flexibility to the EMC.

In general, the EMC includes a regulator function which receives a feedback signal indicating the state of the energy or energy flow in the FAMs. It also includes inputs for a current and/or a voltage related to the gradient current, and the gradient voltage or amplifier module output voltage. The EMC can process these signals in a variety of ways, including non-linear functions such as multipliers, squarers, absolute value functions, and saturating gain block functions (e.g., a sgn ( ) function). Additionally, by properly phasing the PWM drive of each of the FAMs, the effective load ripple frequency can be increased and its amplitude reduced.

These and other features will become more apparent and the present invention will be better understood upon consideration of the following description and the accompanying drawings.

DETAILED DESCRIPTION OF THE EMBODIMENTS OF THE INVENTION

The embodiments selected for description were not selected to limit the invention to the precise forms disclosed. Rather, the embodiments were selected so that one skilled in the art may utilize their teachings.

For reactive loads such as gradient coils, power consumption management brings significant advantages. According to the teachings of the present invention, any number of amplifier modules may be connected in series, provided that an appropriate control scheme is employed to distribute the required gradient voltage among the outputs of these amplifier modules while maintaining the required static and dynamic response of the system. This control mechanism, referred to as the Voltage Management Controller (VMC), is responsible for demanding the appropriate output voltage from each amplifier module. Many VMC configurations are possible, all of which, though different in form, accomplish essentially the same function. It is to be understood that any one of the VMCs described herein may be used as the platform onto which an Energy Management Controller (EMC) according to the present invention may be implemented. In fact, the present invention encompasses all combined permutations of the VMCs and the multiple EMC embodiments described herein. It should be further understood that analog and/or digital inplementations of the systems described herein are contemplated. More implementation in digital or analog form of a variety of components of the systems according to the present invention is considered well within the abilities of one skilled in the art.

Figure 1:
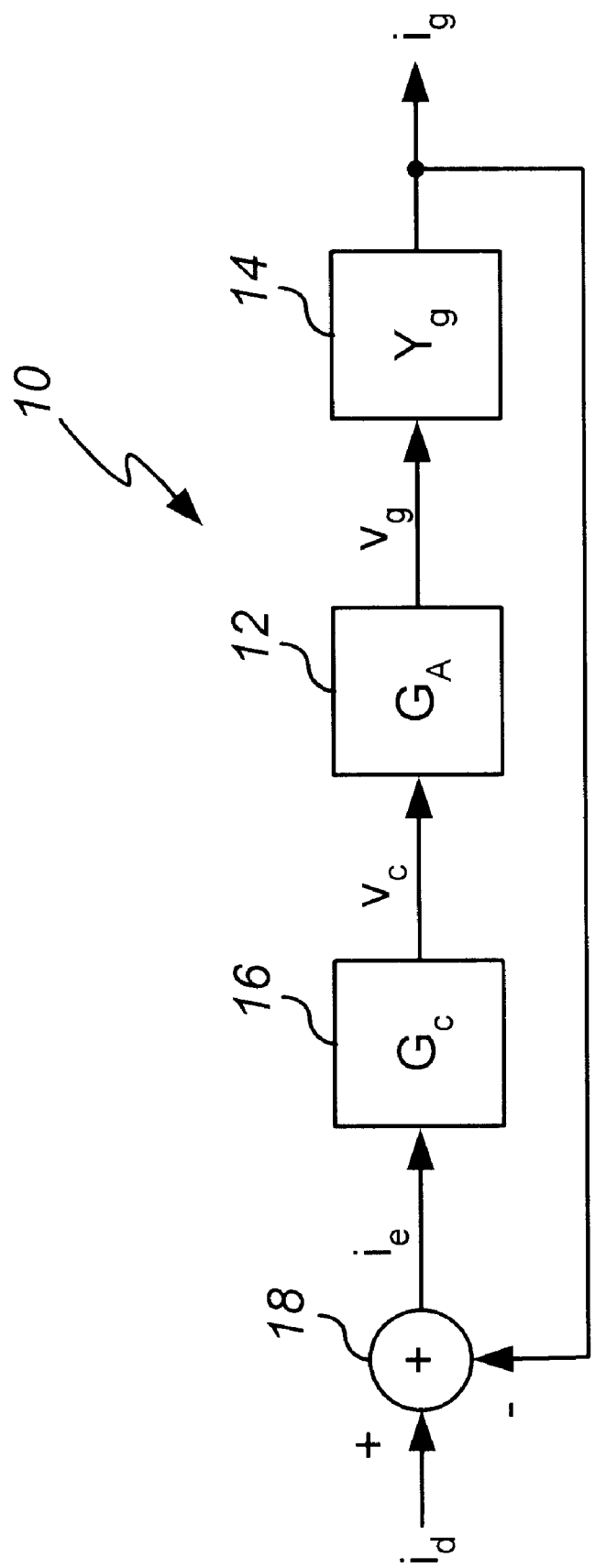
FIG. 1 is a block diagram of a single current controlled amplifier.
Figure 2:
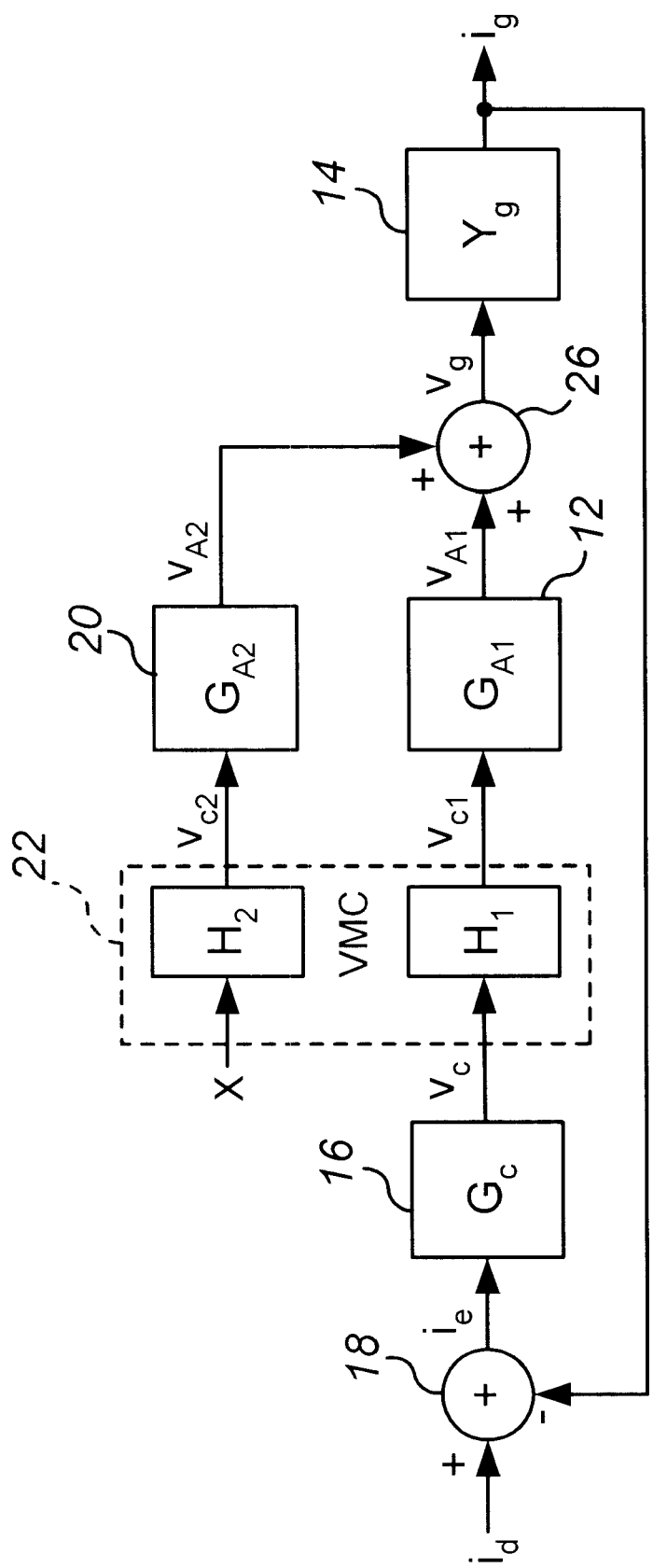
FIG. 2 is a is a block diagram of a current controlled amplifier with two amplifier modules and a generalized Voltage Management Controller (VMC).

Referring now to FIG. 1, a single current controlled amplifier 10 is shown having blocks including an amplifier module 12 with gain $G_A$, a load 14 having admittance $Y_g$, and a current compensator 16 with gain $G_c$. The system variables are current demand signal $i_d$, gradient current $i_g$, current error signal $i_e$, control signal (input to the amplifier) $v_c$, and gradient voltage $v_g$. Gradient current $i_g$ is fed back to a summer 18 where it is combined with demand current $i_d$. When, as in FIG. 2, a second amplifier module 20 is connected in series with amplifier module 12 and load 14 of FIG. 1, a VMC 22 must be added. VMC 22 is shown generically with inputs $v_c$ and x, where x represents one of several signals available within the two-amplifier module amplifier system 24, including $v_c$, $i_d$, $i_g$, $v_{A1}$ (the output of amplifier module 12), or $v_g$ (the output of summer 26).

Figure 3:
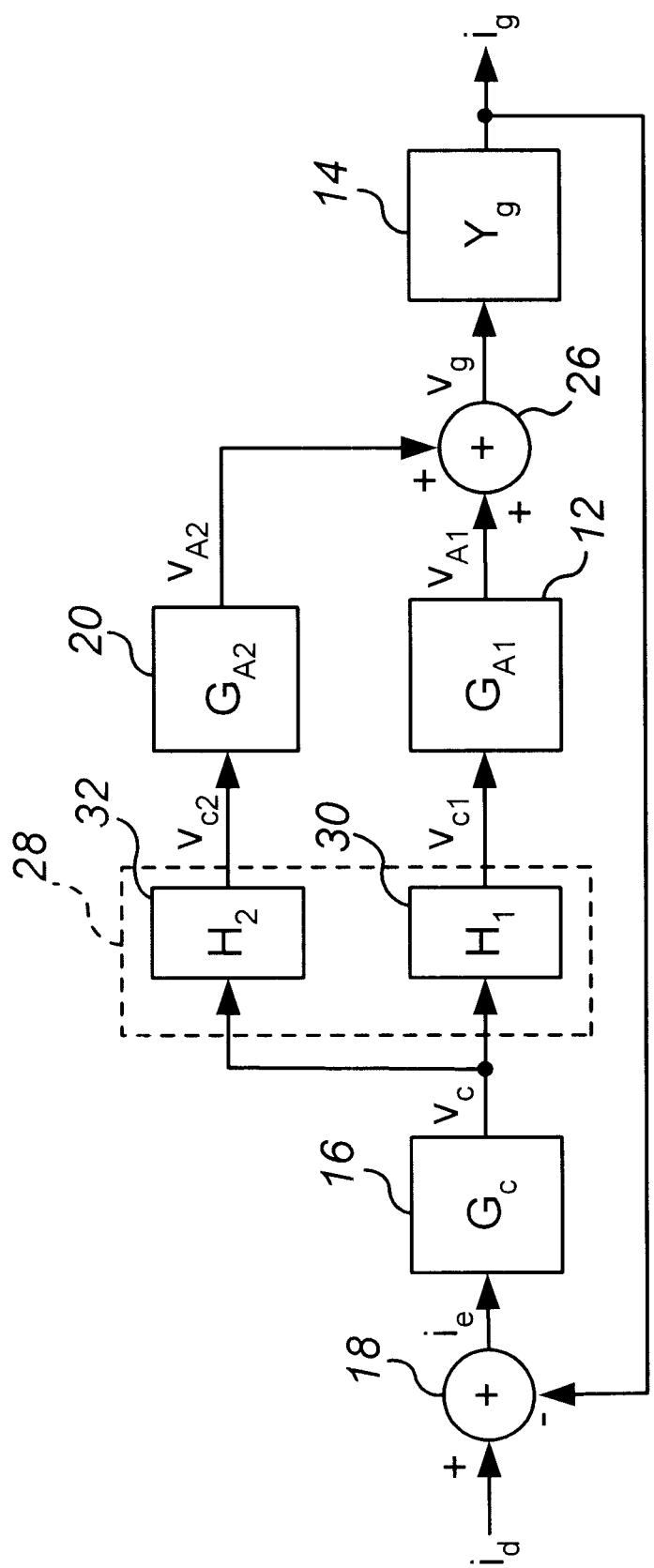
FIG. 3 is a block diagram similar to FIG. 2 showing a simple signal splitter VMC.

VMC 28 of FIG. 3 is a simple, signal splitter configuration, having the control signal $v_c$ apportioned into two signals $v_{c1}$ and $v_{c2}$ which are fed to amplifier modules 12, 20, respectively. Blocks 30, 32 have transfer functions of $H_1$ and $H_2$, respectively, which may or may not be functions of frequency. For example, they might be scalar quantities to render amplifier module output voltages $v_{A1}$ and $v_{A2}$ identical in form. Alternatively, $H_1$ could be a low pass filter and $H_2$ could be a high pass filter. For a load 14 that is highly inductive and slightly resistive, such a configuration would steer high voltage (due to current slewing) to amplifier module 20, while sustained voltages resulting in net power consumption would be provided by amplifier module 12.

Figure 4:
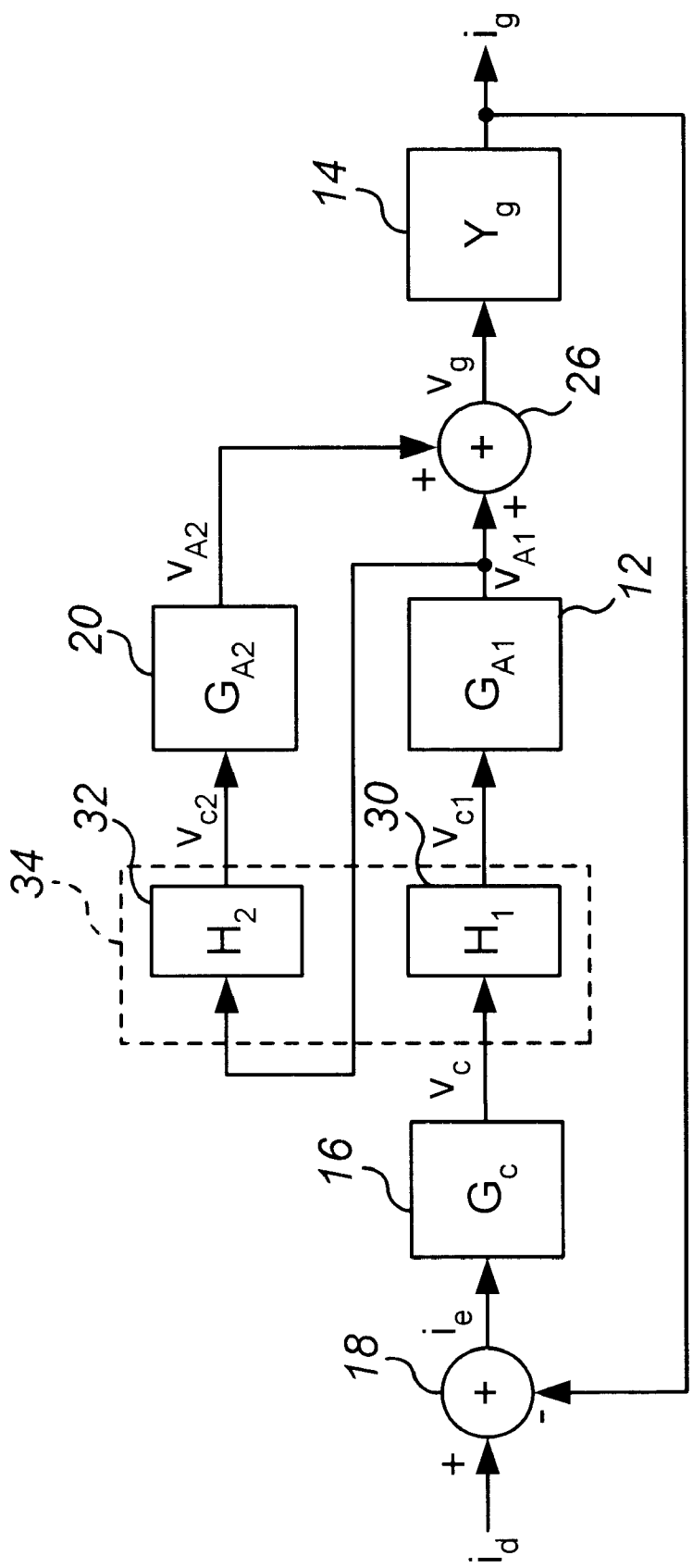
FIGS. 4–7 are block diagrams similar to FIG. 2 wherein input x=$v_{A1}$, $v_g$, $i_g$, and $i_d$, respectively.

FIG. 4 shows VMC 34 wherein input x to block 32 is $v_{A1}$. It should be recognized that amplifier module 20 acts as a voltage multiplier for amplifier module 12 resulting in a gradient voltage that is $(1+H_2G_{A2})$ times that of $v_{A1}$.

Figure 5:
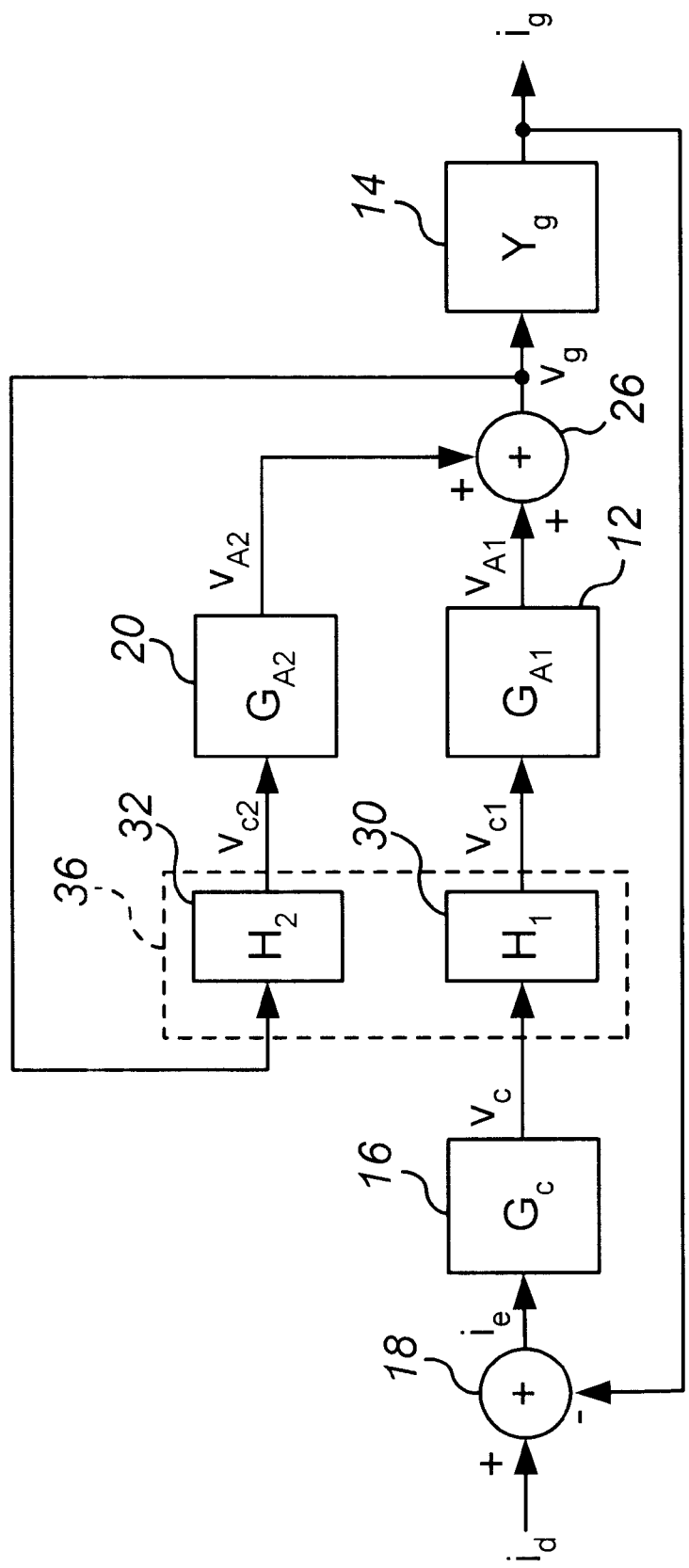

FIG. 5 shows another embodiment wherein input x to block 30 of VMC 36 is gradient voltage $v_g$. This configuration effectively multiplies gradient voltage $v_g$ by a factor $(1+((G_{A2}H_2)/(1-G_{A2}H_2)))$.

Figure 6:
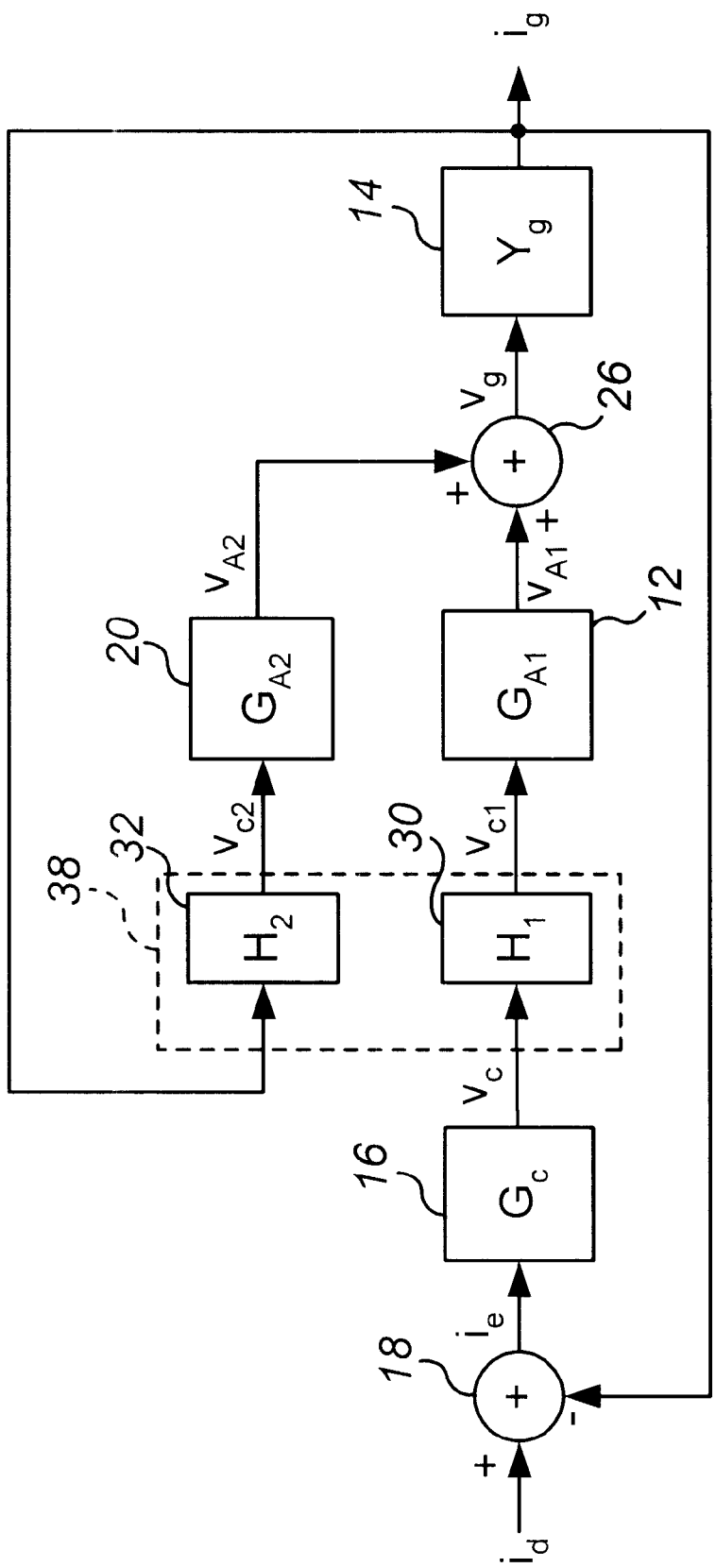

In FIG. 6, input x to VMC 38 is gradient current $i_g$. This feedback may cause amplifier module 20 to appear as a negative impedance, either in proportion to the impedance of load 14, or in proportion to the reactive portion of load 14. If $H_2$ of block 32 includes a differentiator, then the effective load, including load 14 and amplifier module 20, as apparent to amplifier module 12, will have a reduced reactive term.

Figure 7:
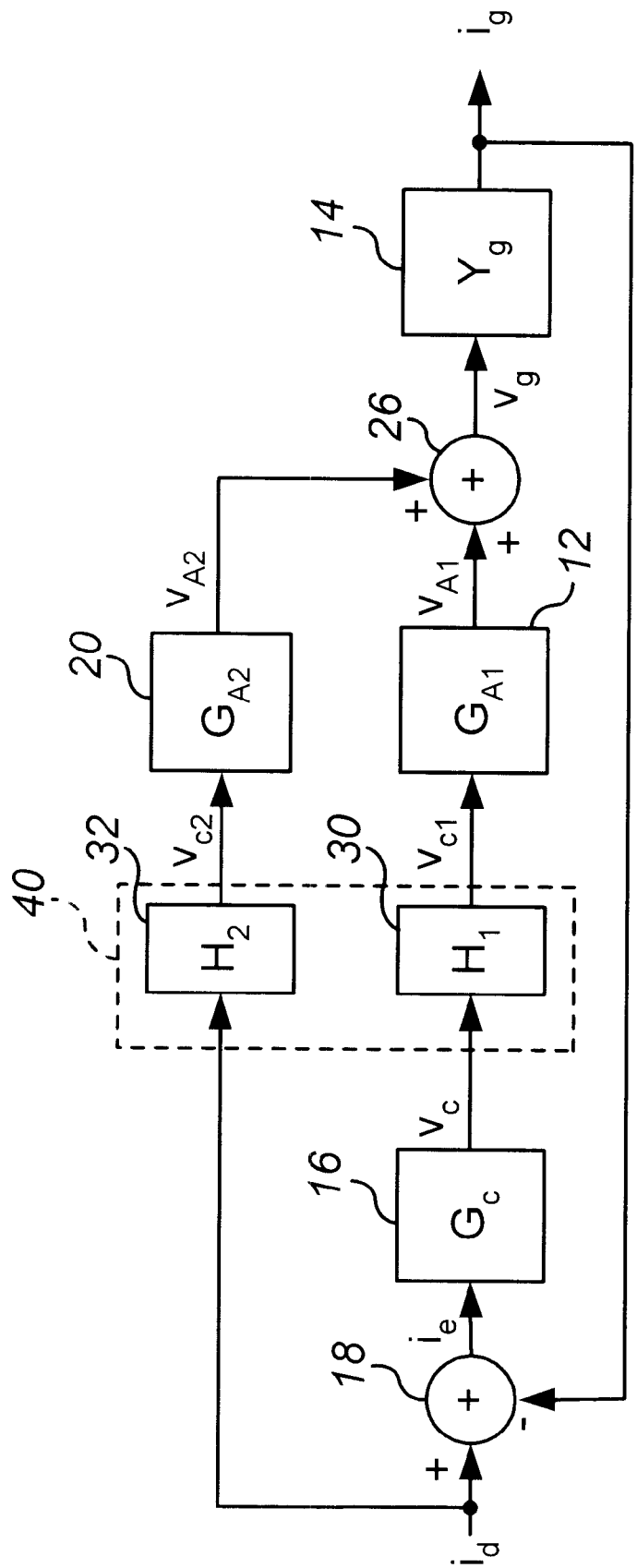
Figure 8:
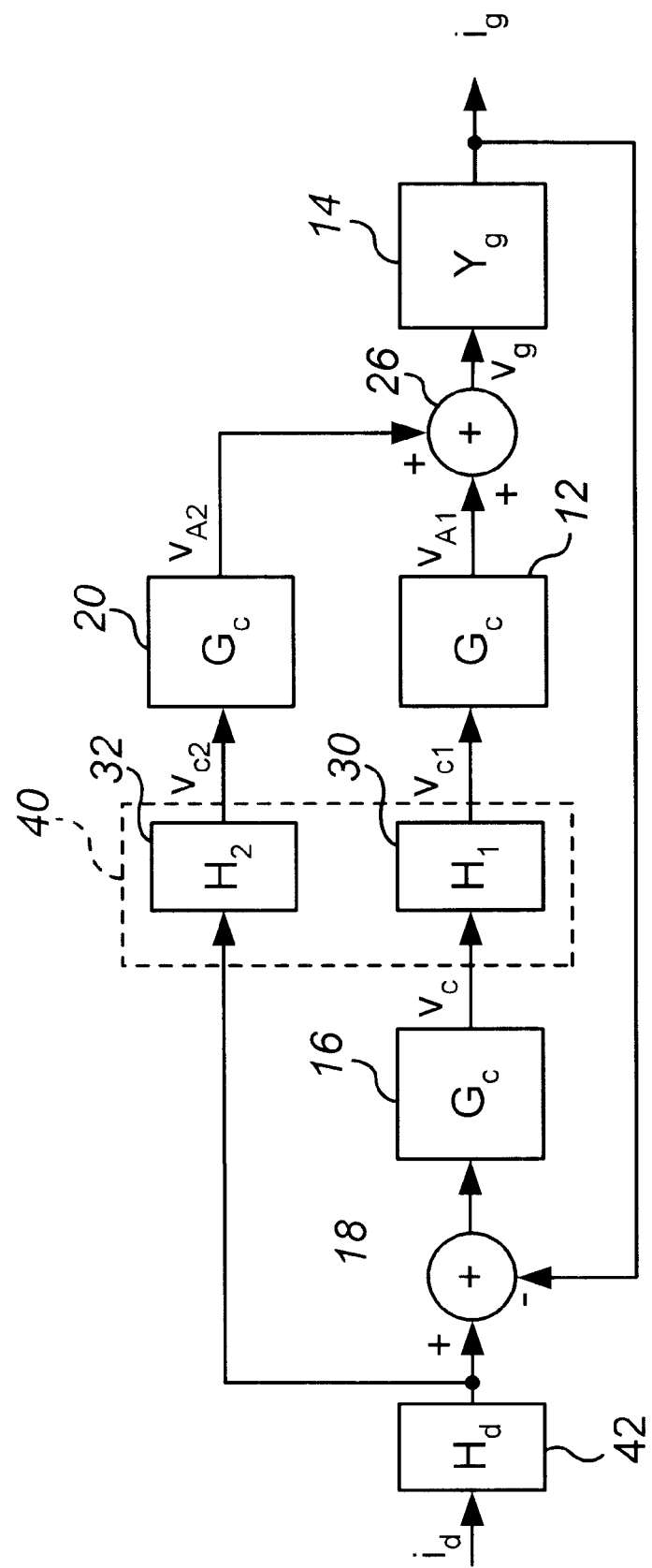
FIG. 8 is a block diagram similar to FIG. 7.

Finally, VMC 40 of FIG. 7 uses demand current $i_d$ as an input. This feed-forward configuration is distinct from the configurations of FIGS. 3–6 which use signals from within the feedback loop. As should be apparent to one skilled in the art, if $H_2$ is a high pass/differentiation function (a requirement if amplifier module 20 is to support a large portion of the voltage needed to drive inductive load 14), then an error will occur in the output response of system 24. Specifically, an overshoot will occur on the leading edge of a rapidly rising gradient current $i_g$. This problem may be corrected by adding a de-emphasis filter 42 in front of summer 18, as depicted in FIG. 8. With $H_2$ being by nature a high pass/differentiation block, $H_d$ will approximate a LPF with unity gain at DC. The pole frequency of $H_d$ should be set as high as possible so as not to decrease the overall system response.

The VMCs depicted in FIGS. 2 through 8 share the characteristic that input signal x produces a response in gradient current $i_g$. The system shown in FIG. 9 includes a modified VMC 44 which results in complete de-coupling of input signal x from gradient current $i_g$. This yields a loop gain that is independent of block 32 gain $H_2$, leaving input signal x to be chosen solely based upon the voltage management requirements amplifier modules 12, 20. As shown, the input signal to amplifier module 20 is subtracted from the input signal to amplifier module 12. Block 46 having a gain of $K_R$ is provided to scale $v_{c2}$ before it is subtracted from $H_1v_c$ at summer 48. It should be understood that block 46 could include both scaler gain terms to account for gain differences in amplifier modules 12, 20 (i.e., $G_{A1}$ and $G_{A2}$), and frequency dependent terms to account for differences in frequency responses of amplifier modules 12, 20.

Figure 10:
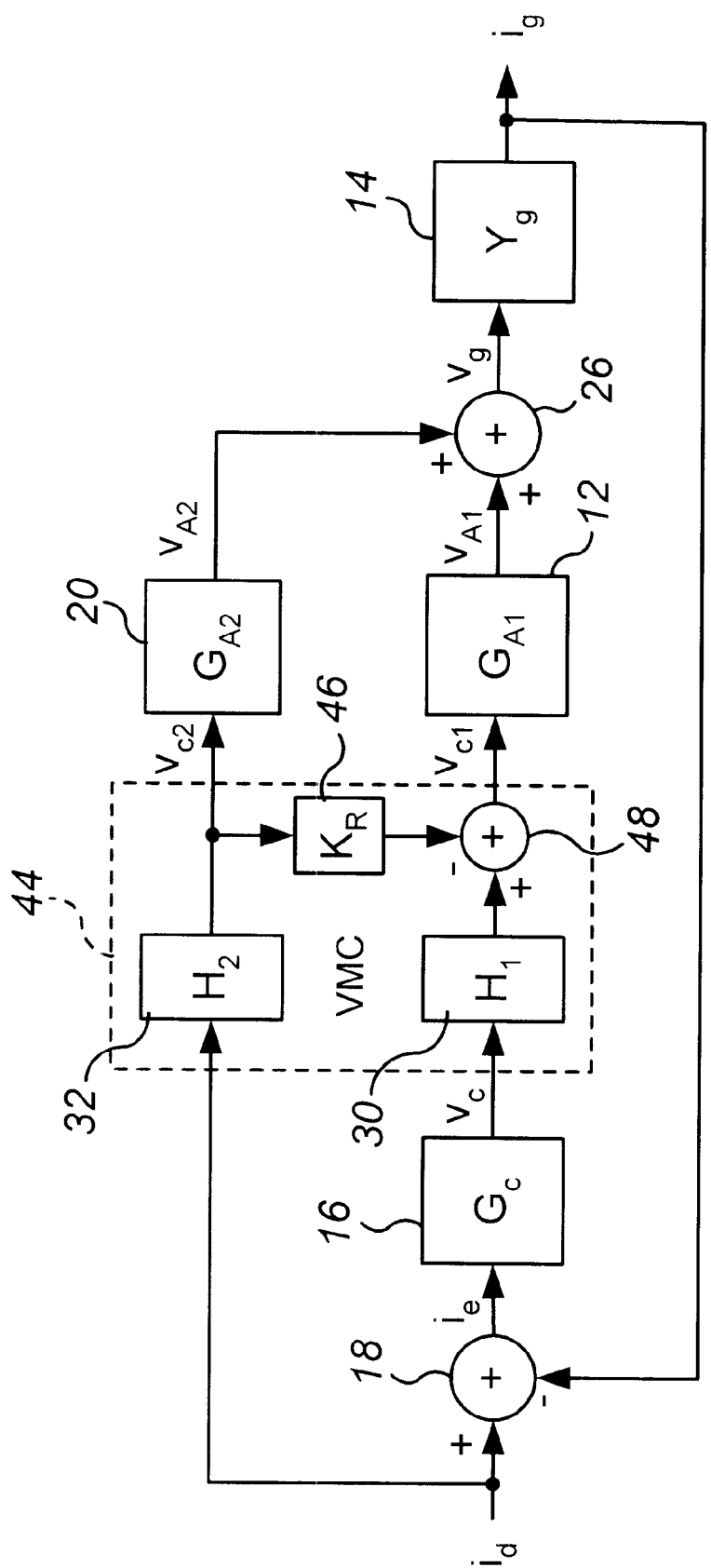
FIG. 10 is a block diagram similar to FIG. 7 with a zero-sum VMC.

This type of signal management is referred to as zero-sum injection since a perturbation at $v_{A2}$ is negated at summer 26 by an equal and opposite perturbation at $v_{A1}$. A zero-sum injection VMC 44 is especially advantageous in a feed-forward $i_d$ derived system as shown in FIG. 10 since it eliminates the drawbacks of the system of FIG. 7 (e.g., undesirable overshoot), which led to the system of FIG. 8. It should be understood, however, that a significant advantage of the system of FIG. 10 is that input signal x maybe of any form, including non-linear signals and signals with bandwidths larger than that of the main current loop. The ability to employ a non-linear input signal x greatly enhances the design flexibility of possible energy management schemes as is further described below.

With a reactive load 14 which is inductive, much of the energy delivered to load 14 is stored and may later be returned to amplifier modules 12, 20. Some energy, however, is actually dissipated in the resistive portion of load 14. Consequently, it is desirable to control the individual voltage delivered by each amplifier module 12, 20 such that one module delivers mostly real power and the other module delivers mostly reactive power to load 14.

Figure 9:
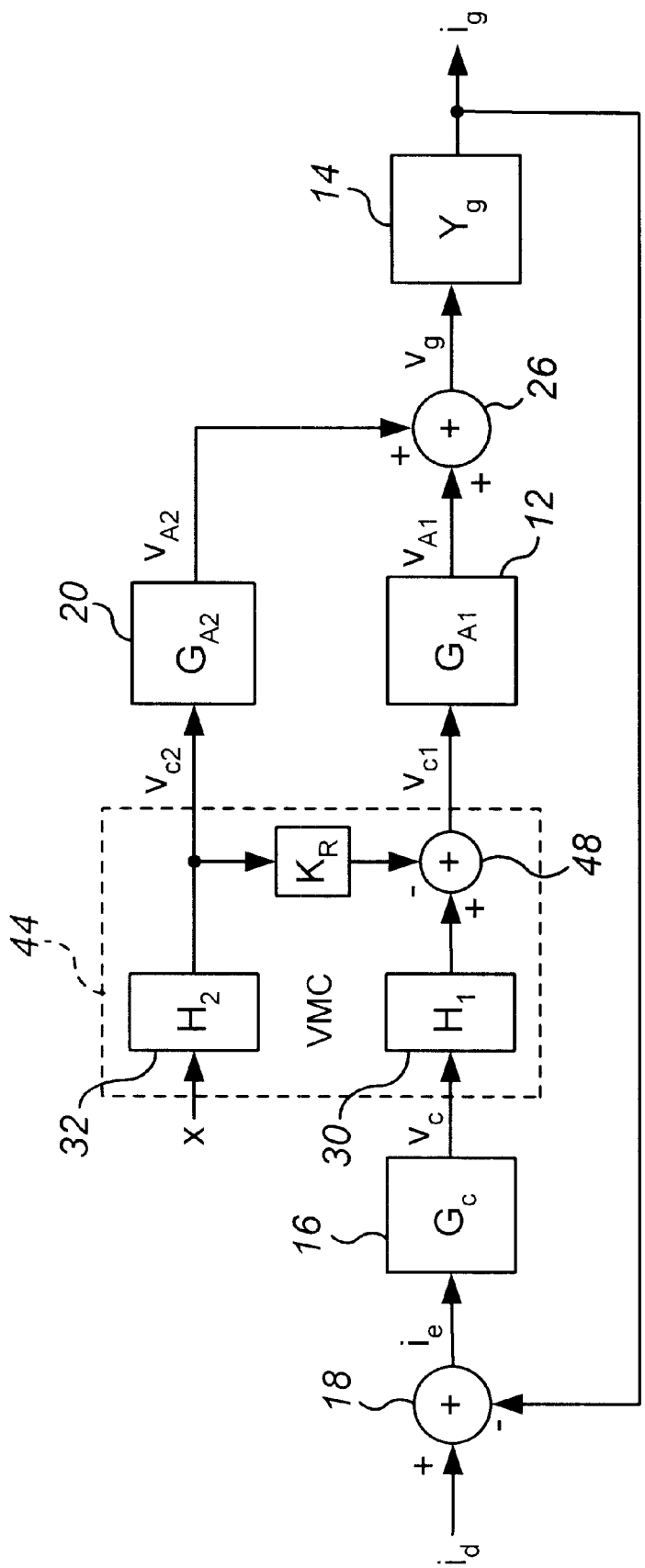
FIG. 9 is a block diagram similar to FIG. 2 showing a zero-sum VMC.
Figure 11:
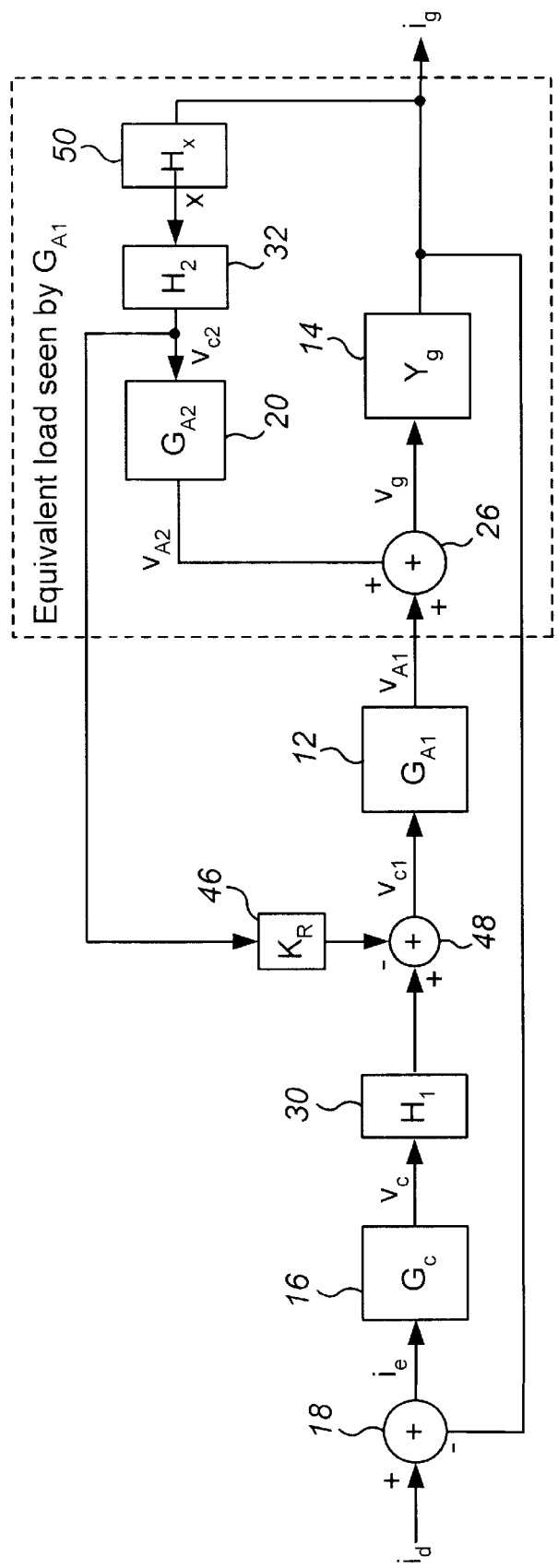
FIG. 11 is a block diagram of the system of FIG. 6 redrawn to show the active load seen by one of the amplifiers.
Figure 12:
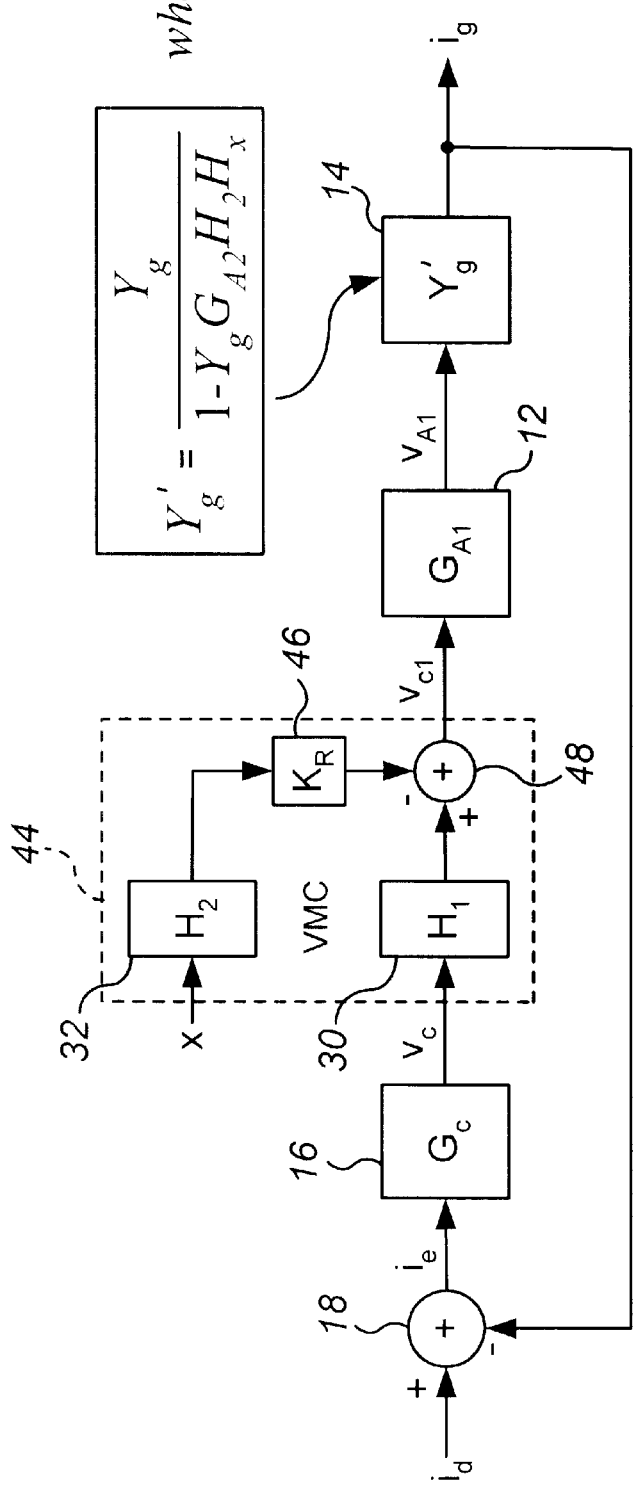
FIG. 12 is a block diagram of the system of FIG. 11 redrawn to show the effective load.

To better understand the use of voltage management as a means of controlling net power flow, the gradient system of FIG. 9 has been redrawn in FIGS. 11 and 12. FIG. 12 shows admittance $Y_g'$ of load 14 combined with amplifier module 20. As described above, input signal x can be defined as any state variable inside system 24. For example, if $x=i_g$, then the transfer function of block 50, $H_x$, equals 1 since $H_x=x/i_g$ (see FIG. 12). If $x=i_d$, then $H_x=(1+G_cH_1G_{A1}Y_g)/(G_cH_1G_{A1}Y_g)=1$ for $G_cH_1G_{A1}Y_g>>1$. Since most of the energy transfer to load 14 occurs well within the bandwidth of the GAS, $i_g$ and $i_d$ can be assumed to be equal, and $H_x$ approximated as unity. The impedance associated with load 14 combined with amplifier module 20, $Z_g'=1/Y_g'$, can be modified according to $Z'_g=Z_g-G_{A2}H_2H_x=Z_g-\Delta Z$ using the formula for admittance $Y'_g$ of FIG. 12. In MRI gradient coils, $Z_g=R_g+sL_g$, ignoring the eddy current effects of the coil as well as higher frequency effects near and above self-resonance. The effective load impedance as seen by amplifier module 12 becomes $Z'_g=(R_g-\Delta R)+s(L_g-\Delta L)$, where the real and imaginary parts of $\Delta Z$ are shown. As should be apparent, changes to the imaginary part do not affect the net power delivered by amplifier module 12, but do affect the peak voltage that amplifier module 12 must deliver. Conversely, changes to the real part affect the net power delivered by amplifier module 12, but do not substantially affect the peak voltage that module 12 must deliver (assuming $X_L=S(L_g-\Delta L)$ is much larger than $R_g$). This assumption is valid during high slew rates of gradient current $i_g$, but invalid once $i_g$ plateaus. Thus, by appropriately choosing $\Delta L$, the peak voltage delivery of amplifier module 12 may be managed. Similarly, by appropriately choosing $\Delta R$, the net power delivered by amplifier module 12 may be managed. With $\Delta Z=G_{A2}H_2H_x$, $H_2H_x$ must be a proportional-derivative (PD) type gain block, where a positive proportional term reduces the effective load resistance, while a positive derivative term reduces the effective inductance as seen by amplifier module 12.

When a positive proportional term $\Delta R$ is present, the amplifier module 20 acts as a negative resistance, as apparent to amplifier module 12, thereby reducing the net portion of load resistance which amplifier module 12 must support. If $\Delta R$ is made large enough, the effective resistance may be zero or even negative. Thus, amplifier module 20 supplies energy to amplifier module 12. If $\Delta R$ is negative, then energy flows in the opposite direction, and amplifier module 12 supplies energy to amplifier module 20 to compensate for the internal power dissipation of amplifier module 20, thereby decreasing the required power supply kVA rating of amplifier module 20.

Although system 24 of FIGS. 11 and 12, with an appropriate choice parameters of VMC 44 (determined by $H_2H_x$), is useful in shaping the net power delivered by each amplifier module 12, 20, system 24 is not capable of managing energy dynamically. The addition of proportional feedback from $i_g$ to $v_{A2}$ can decrease and even change the polarity of net power flow from either amplifier module 12, 20, but such feedback does not change dynamically as a function of changing coil resistance or changing internal power dissipations of an amplifier module. Thus, the kVA rating of the power supply of one of the amplifier modules may only be reduced. The power supply current cannot be eliminated. The amount of feedback (the effective value of $\Delta R$) is chosen based upon one operating point, and under all other conditions, power must still be supplied to the amplifier module. The goal, however, is a controller that reduces the power requirements of a series connected amplifier to no more than its quiescent requirements (the power that is dissipated when $i_g=0$). As described below, the Energy Management/Controller (EMC) achieves this goal.

Figure 13:
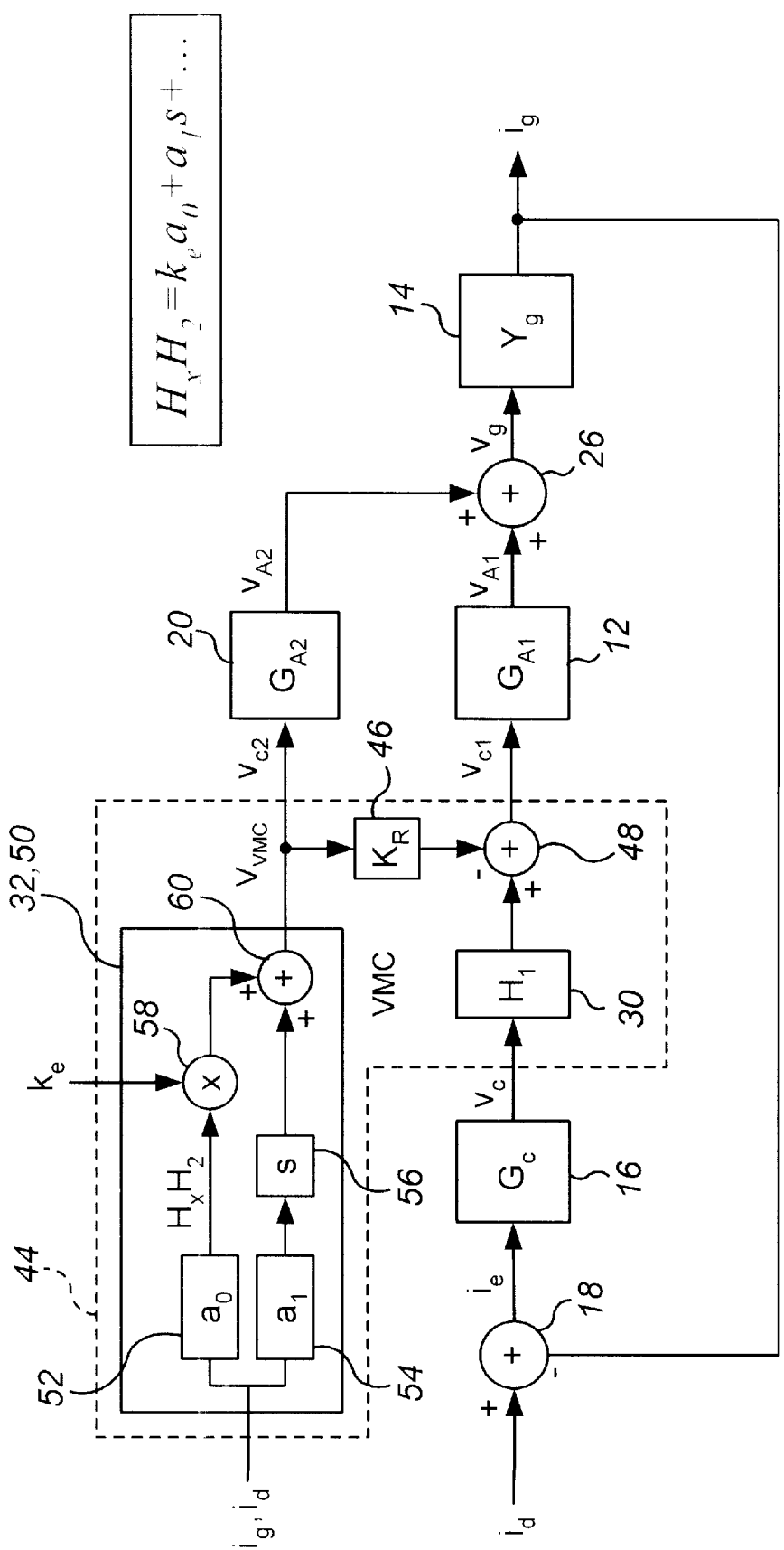
FIG. 13 is a block diagram of an embodiment of the system of FIG. 13.{12?}
Figure 14:
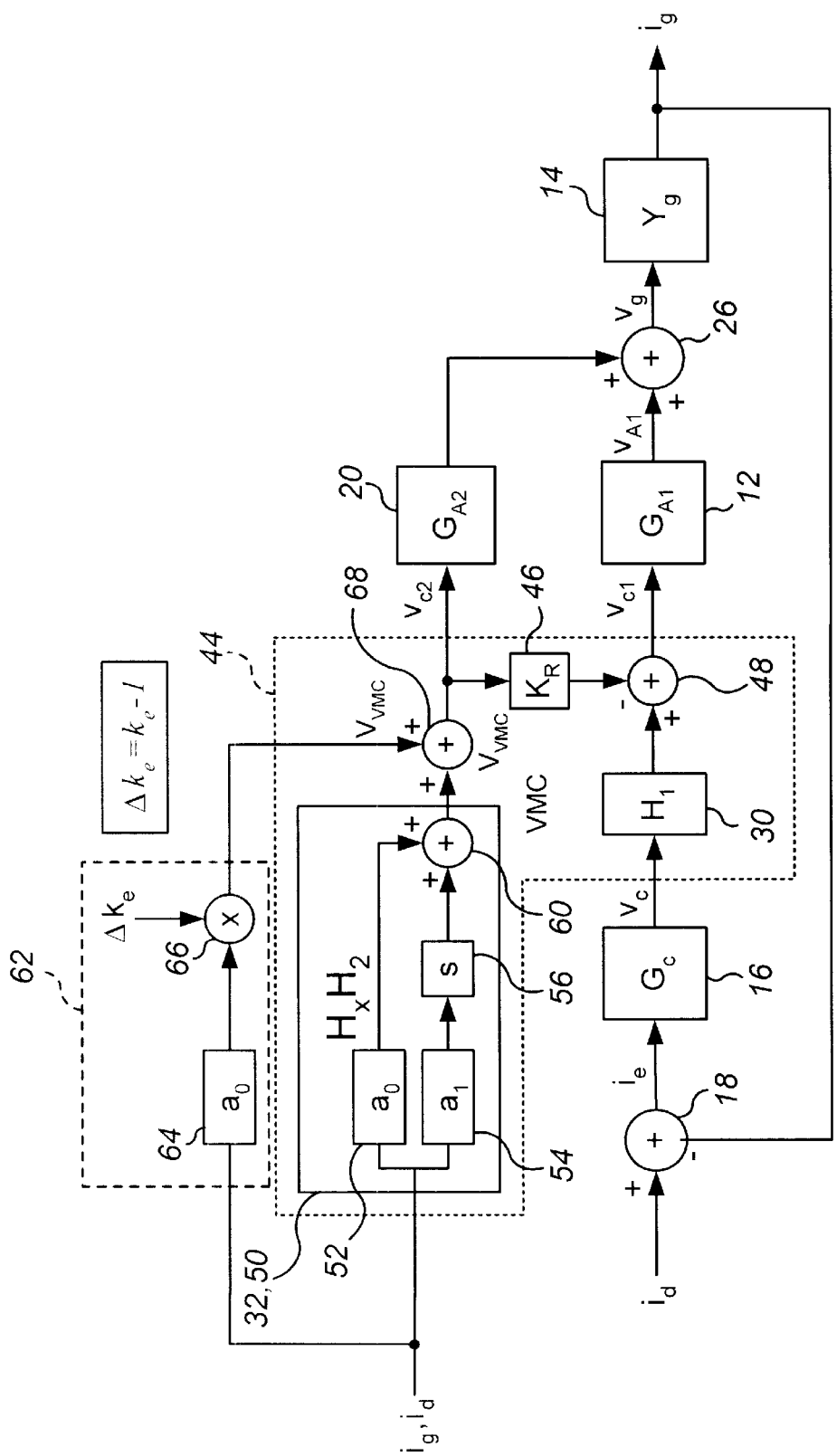
FIGS. 14 and 15 are block diagrams of an Energy Management Controller (EMC) and a zero-sum VMC which, share a zero-sum function.

Referring now to FIGS. 13 and 14, $H_2H_x$ blocks 32, 50 are shown in proportional-derivative block form with a variable control signal $k_e$ fed into multiplier 58 of the proportional term. FIG. 13 shows one embodiment of the variable proportional feedback. Blocks 52, 54, 56, and summer 60 have been added to illustrate a possible transfer function $H_2$ of block 32. The proportional term is $a_0k_e$, where $k_e$ can be varied in amplitude and polarity. Input signal $k_e$ can be derived from a non-linear, non-stationary source since $v_{c2}$ is zero-sum injected. If $k_e$ is redefined as $k_e=1+\Delta k_e$, then system 24 can be represented as shown in FIG. 14. The proportional term $\Delta k_e$ is outside VMC 44, and is part of EMC 62 as further described below. Term $\Delta k_e$ is multiplied by the gain $a_0$ of block 44 at multiplier 66. Although EMC 62 output $v_{emc}$, which is added to the output of blocks 32, 50 at summer 68, can take on any form, to modify the net power delivered by each amplifier module 12, 20, $v_{emc}$ should be the same polarity as gradient current $i_g$ as often as possible (i.e., a large fundamental that is in phase with the fundamental of $i_g$). Consequently, the EMCs described herein will make use of a signal which is derived from gradient current $i_g$.

Figure 15:
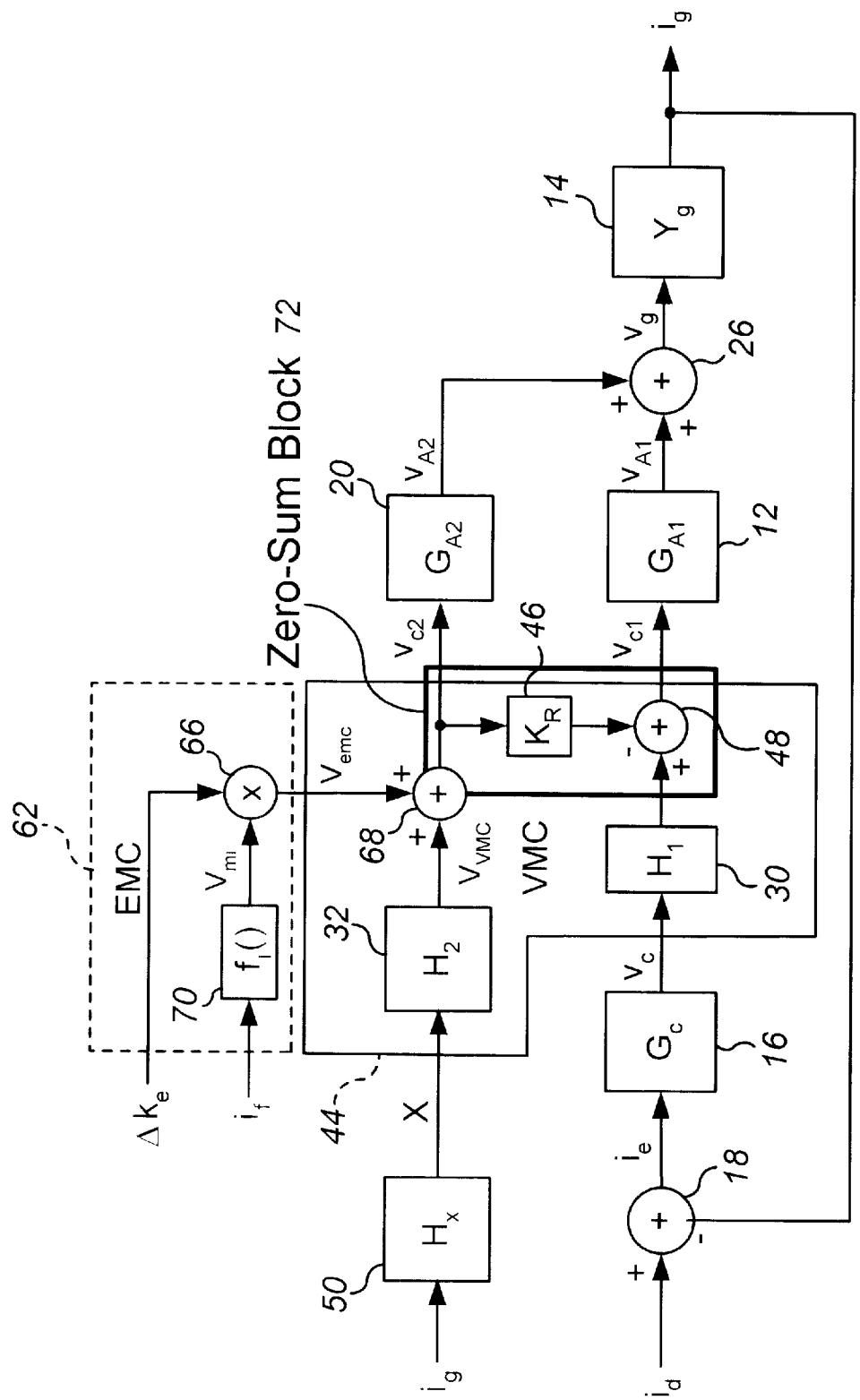

As shown in FIG. 15, this signal is referred to generally as $i_m$ $v_{mi}$ and is defined as: $v_{mi}=f_i(i_f)$, where the current shaping function $f_i()$ of block 70 replaces $a_0$ as an arbitrary function, linear or nonlinear. The input to block 70 is $i_f$, a signal which is of the form of gradient current $i_g$. Any system state variable could be used as $i_f$ (e.g., $i_f=i_g$, $i_d$, $v_gY_g$, $v_cH_1G_{A1}Y_g$, etc.). It should be noted that in FIG. 15, VMC 44 and EMC 62 share a common zero-sum block 72 (block 46 and summer 48).

Figure 16:
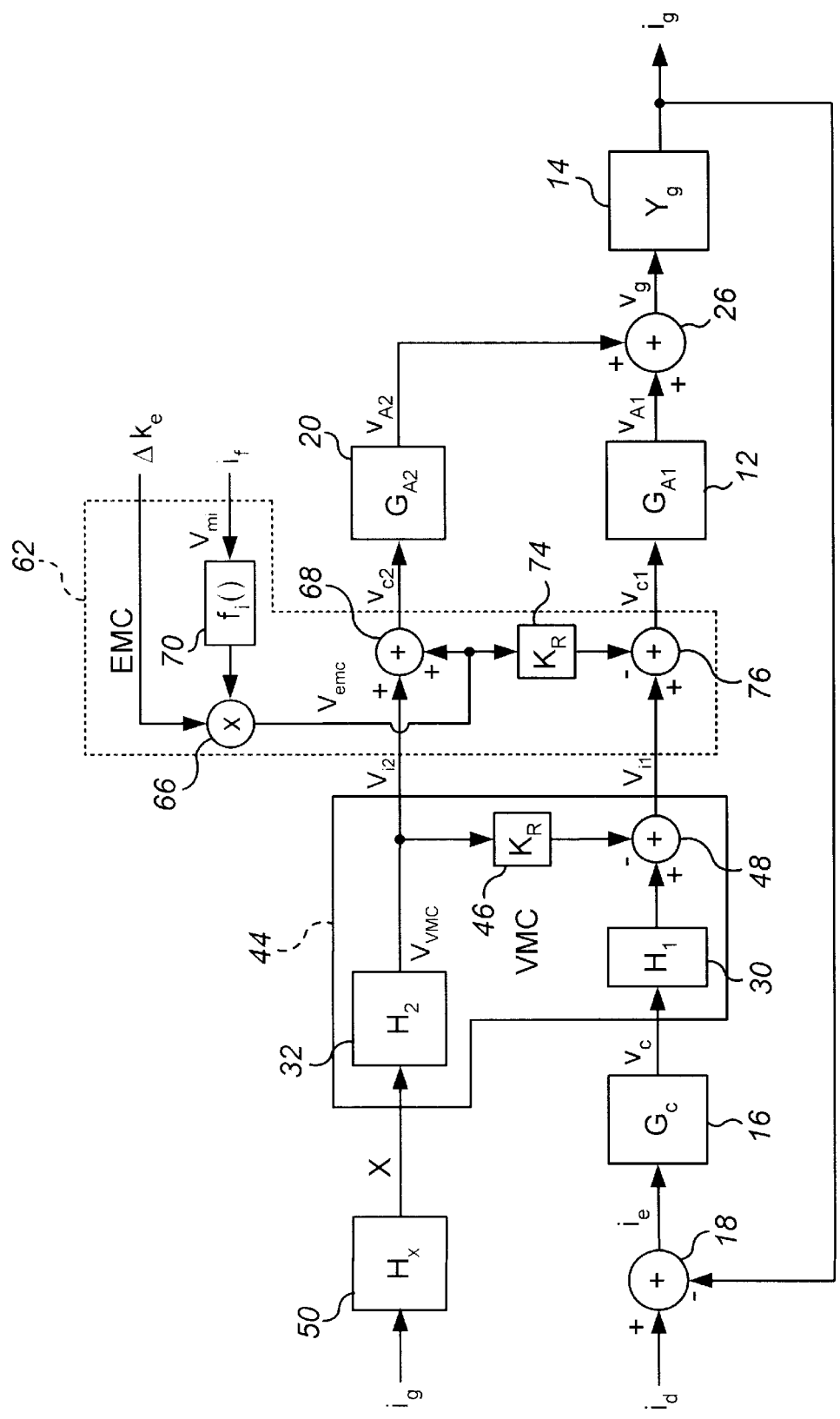
FIGS. 16 and 17 are block diagrams similar to FIG. 15 with the EMC decoupled from the VMC.
Figure 17:
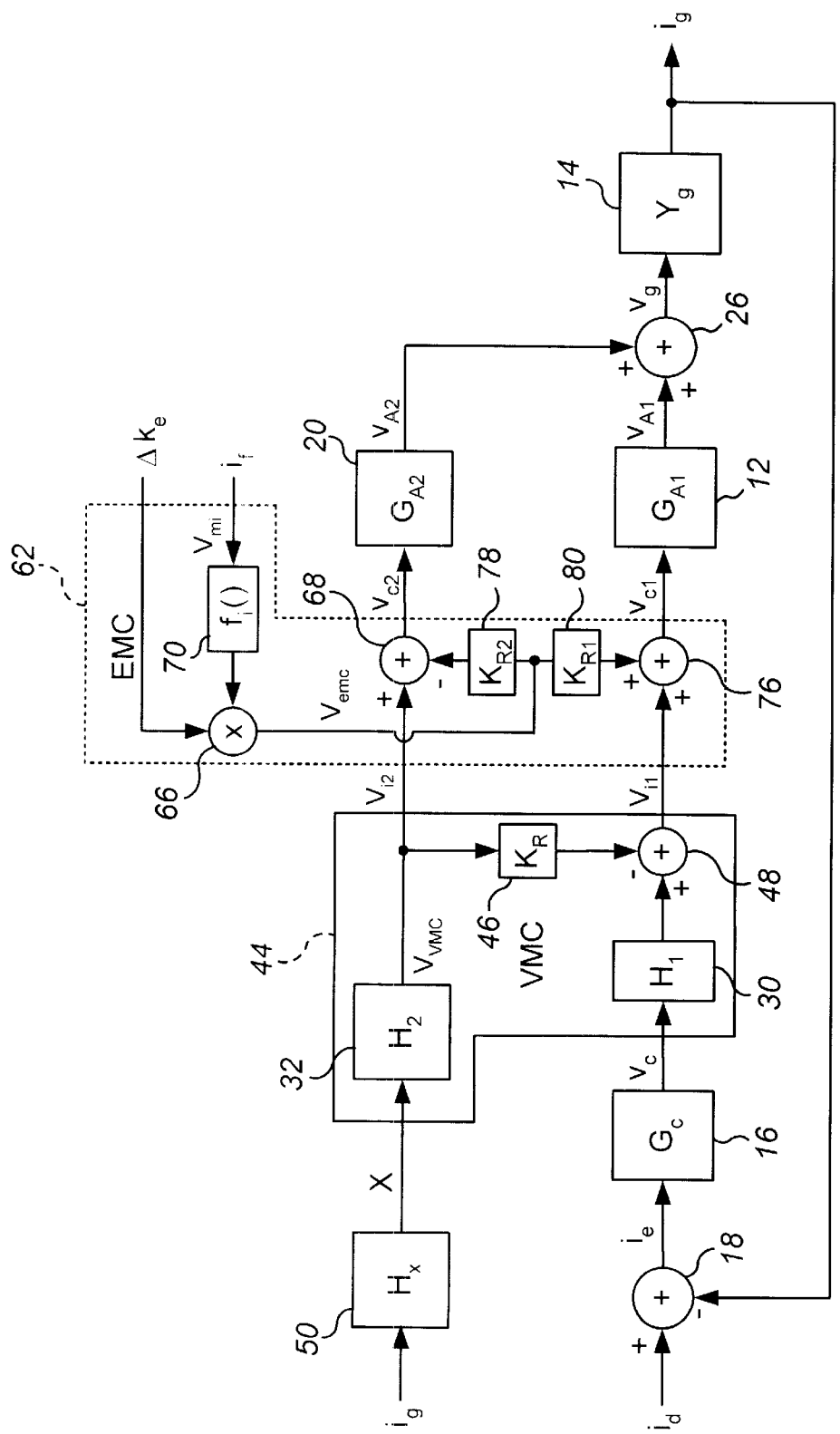

Referring to FIG. 16, VMC 44 and EMC 62 can be fully separated by adding a separate zero-sum block including block 74 and summer 76 for EMC 62. Finally, FIG. 17 shows EMC 62 in which block 74 has been replaced with blocks 78, 80 ($k_{R1}$ and $k_{R2}$), and the polarity of zero-sum summers 68, 76 has been inverted. This inversion ensures that a positive value of $\Delta k_e$ causes a net energy transfer from amplifier module 12 to amplifier module 20 where $k_{R1}$ and $k_{R2}$ are both positive quantities.

The above-derived EMC 62 provides a system 24 in which the energy flow from the AC mains enters almost exclusively through amplifier module 12 with very little (if any) energy flowing directly to amplifier module 20. EMC 62 can manage both energy and power flow. If the rail voltage of the amplifier module 20 is controlled, then EMC 62 manages the energy stored in that amplifier module. Alternatively, the net power delivered by the power supply powering amplifier module 20 (or the net current delivered by the power supply) may be controlled to equal a particular value such that EMC 62 manages power. Both forms of control achieve the same goal as described in detail below.

Referring again to FIG. 17, the net increase in power delivered by amplifier module 12 is equal to the net power received by amplifier module 20 or the managed power, may be expressed $p_m(t)=\Delta p_{A1}(t)=-\Delta p_{A2}(t)=i_g(t)g_{A1}v_{emc}(t)$, where a zero-sum EMC is assumed, $K_{R1}=1$, and $g_{A1}$ is the DC gain of amplifier module 12, which is generally a function of frequency. The net power $p_{ps2}(t)$ delivered by the power supply to amplifier module 20 can be expressed as a function of $p_m(t)$ as $p_{ps2}(t)=p_{Rg2}(t)+p_{A2}(t)-p_m(t)$ where $p_{Rg2}$ is the net power delivered by amplifier module 20 to the gradient coil resistance, and $p_{A2}$ is the average power dissipated inside the module. These quantities can be expressed as $$P_{Rg2}(t)=\Delta R i_g^2(t)=Re[G_{A2}H_2H_x]i_g^2(t) \quad \text{(Equation 1)}$$

and $$P_{A2}(t) = P_Q + k_v|i_g(t)| + k_r i\frac{2}{g}(t) \quad \text{(Equation 2)}$$

where it has been assumed that module 20 is a high efficiency PWM switch-mode amplifier, and its losses are most dominantly a function of output current. As is known by those skilled in the art, variations in power dissipation as a function of output voltage are usually a secondary effect in PWM power circuits.

These variations depend on duty cycle, coupled with differences in conductivity of diodes and transistors. In many designs, particularly where switching frequencies are relatively high, these variations are nominal compared to the larger switching losses that are not functions of output voltage. The three quantities, $P_Q$, $k_v$, and $k_T$, (from Equation 2 which defines amplifier power dissipation) are parameters for a given amplifier, and do not change except for possible variations with temperature.

Based upon the above definitions, the average power $P_{ps2}$ delivered to amplifier module 20 may be calculated as $$P_{ps2} = \frac{1}{TR}\int_0^{TR} [p_{Rg2}(t) + p_{A2}(t) - p_m(t)]dt = \quad \text{(Equation 3)}$$

$$P_Q + (\Delta R + k_r)I_g^2(RMS) + k_v I_g(mag) - P_m$$

average managed power $P_m$ may be calculated as $$P_m = \frac{1}{TR}g_{A1}\int_0^{TR} i_g(t)v_{emc}(t)dt \quad \text{(Equation 4)}$$

where TR is the repetition time of the gradient waveform, although this does not imply that the signal must be repetitive. $I_g(RMS)$ and $I_g(mag)$ represent the RMS and average magnitude of $i_g(t)$, respectively. For a specified input power to amplifier module 20, the managed power $P_m$ as defined in Equation 4 must satisfy the expression $$P_m=P_Q+(\Delta R+k_r)I_g^2(RMS)+k_v I_g(mag)-P_{ps2} \quad \text{(Equation 5)}.$$

If the power supply is specified to support only the quiescent power dissipation, then managed power $P_m$ must be $$P_m = \frac{1}{TR}g_{A1}\int_0^{TR} i_g(t)v_{emc}(t)dt = \quad \text{(Equation 6)}$$

$$(\Delta R + k_r)I_g^2(RMS) + k_v I_g(mag).$$

It is evident that Equation 6 can be satisfied by designing $v_{emc}$ to have shared harmonics with a gradient current $i_g$ of sufficient magnitude. Increasing $v_{emc}$ does, however, reduce the available headroom of amplifier module 12 because $v_{emc}$ produces a change in the output of amplifier module 12 which is equal to $$\Delta v_{A1}(t)=G_{A1}k_{R1}v_{emc} \quad \text{(Equation 7)},$$

a voltage which could otherwise be made available to load 14. Therefore, the goal of maximizing the managed power $P_m$ conflicts with the goal of minimizing the loss of headroom of amplifier module 12. However, by selecting the appropriate signal form $v_{emc}$ the managed power $P_m$ may be maximized without merely increasing the amplitude of $v_{emc}$.

It should be understood that the treatment of amplifier module 12 as transferring a net power to amplifier module 20 is merely a convention. If it is assumed that amplifier module 12 supplies all of the required power of amplifier module 20, then the power supply powering amplifier module 12 will be rated based on the total system power requirements. Since the gradient coil of an MRI system does not usually need to be isolated from the AC mains, a high efficiency, low complexity, low cost, non-isolated power supply can be used to power amplifier module 12. Consequently, amplifier module 12 may be referred to as the Grounded Amplifier Module (GAM 12), even though it does not have to be ground-referenced since the power supply could be isolated from the AC mains. Amplifier module 20 may be referred to as the Floating Amplifier Module (FAM 20) since it is powered by GAM 12. In general, GAM 12 and FAM 20 may actually represent two sets of amplifier modules, or a single GAM and an even number of FAMs divided evenly about the GAM.

Figure 18:
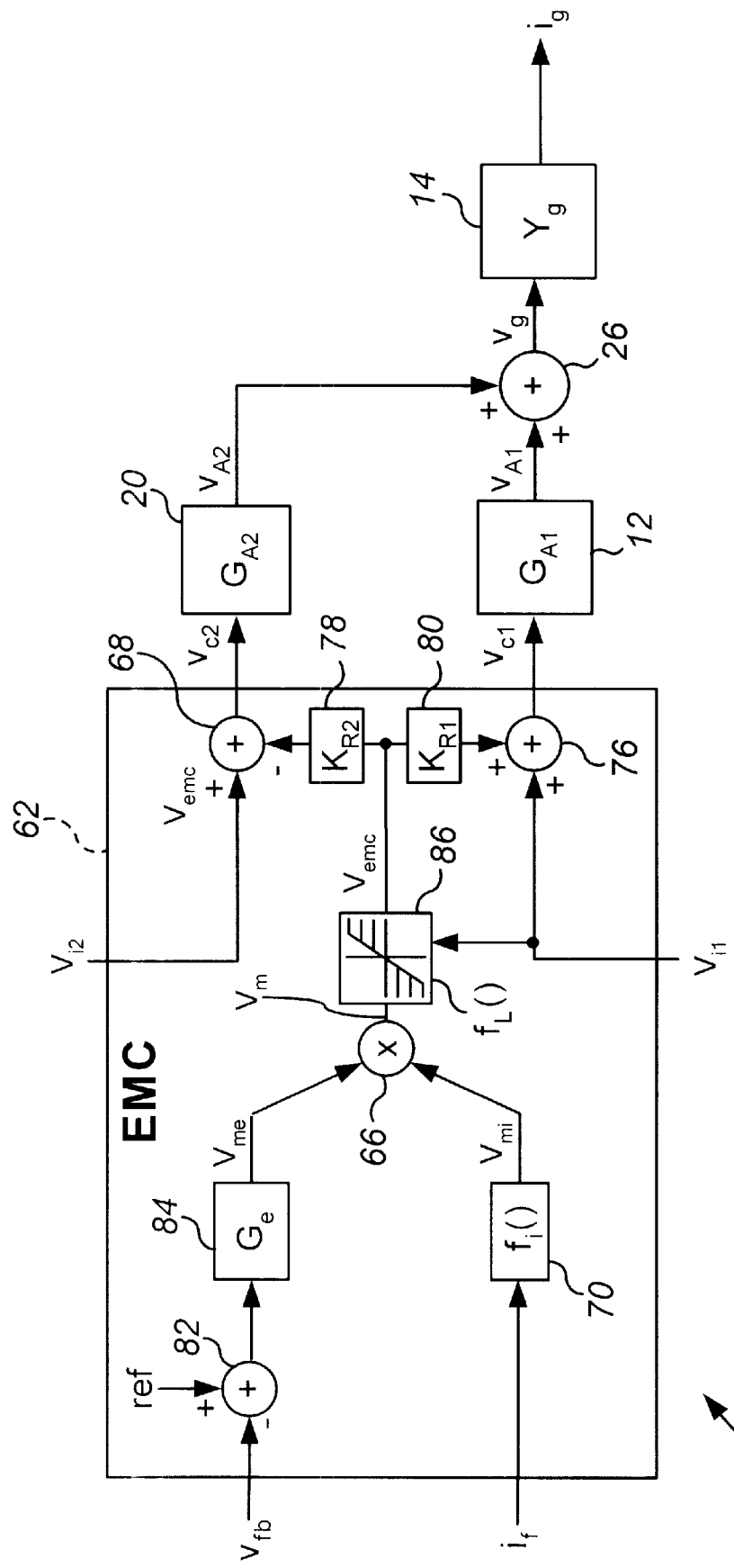
FIG. 18 is a block diagram of an EMC according to the present invention having a variable limiter circuit.

Referring to FIGS. 15 and 18, linear current fed EMC 62 is a special case of an EMC where the current shaping function $f_i()$ is defined as $f_i(i_f)=c_o i_f$ where $c_o$ is a scaler. The multiplier input $\Delta k_e$ is simply the output of a voltage regulating loop, which monitors the rail-to-rail voltage of amplifier module 20 compares it to a reference signal $v_{ref}$ at summer 82 and feeds it to a compensating error amplifier block 84 having a transfer function $G_e$. EMC 62 is closely related to the mechanisms of power management already present in VMC 44. $v_{emc}$ is a signal that is proportional to gradient current $i_g$, but scaled by an amount $\Delta k_e$.

To determine the peak voltage of amplifier module 12, the type of gradient waveformn must first be defined. When producing a trapezoidal waveform, the peak voltage delivered by amplifier module 12 occurs just before gradient current $i_g$ reaches its final value. At that time, maximum voltage is delivered to coil 14 inductance as well as coil 14 resistance. For a sinusoidal waveform, it can be assumed that $1/(N+1)^{th}$ of coil 14 voltage is supplied by amplifier module 12, where N is the ratio of the FAM rated voltage to the GAM rated voltage.

As should be apparent to one skilled in the art, EMC 62 has far less effect on available voltage when driving sinusoidal gradients versus trapezoidal gradients. This is an obvious consequence of the trapezoidal gradient having a maximum and constant current slope from zero amps to maximum current, while the sinusoidal gradient current has a maximum slope only at zero current and a zero slope at maximum current. Linear current-fed EMC 62 is very effective at managing power with minimal loss of voltage headroom for sinusoidal gradients, but significantly more voltage loss is incurred for trapezoidal gradients. Use of a non-linear EMC, however, improves upon the voltage loss incurred when driving trapezoidal currents.

As described above, for trapezoidal and sinusoidal gradient currents, all forms of EMCs 62 result in a loss of available voltage from amplifier module 20. Trapezoidal currents result in the largest loss of available voltage, which cannot be significantly improved by modifying $f_x(\ )$ because maximum load voltage is required for the entire trajectory of current, from no current to maximum current. In fact at maximum current, both large and small load voltages are present. Consequently, it would be helpful for EMC 62 to have knowledge of the voltage of load 14, and attenuate control signal $v_{emc}$ when large voltages are required. This would solve the trapezoidal signal problem by effectively reducing and even eliminating the activity of EMC 62 during rapid ramping of gradient current $i_g$. Ideally, EMC 62 would cause no reduction in available voltage to load 14, regardless of the type of gradient waveform.

In order to guarantee that amplifier module 20 will never be driven into clip by EMC 62, the voltage that needs to be acted upon is $G_{A1}v_{i1}$, the portion of the voltage of load 14 that current error amplifier 16 is expecting amplifier module 12 to produce. This signal must have priority over EMC 62 control signal $v_{emc}$. This can be accomplished by using a variable limiter circuit as depicted in FIG. 18. The limiter 86 is in line with the control signal $v_{emc}$, and has an input from $v_{i1}$ for setting its clip level or the limit of limiter 86. In order to maximize the voltage to load 14, the signal $v_{i1}$ (or its equivalent) should be sensed. Alternatively, the voltage of load 14 (or its equivalent, e.g., $Y_g i_g$, $Y_g i_d$, etc.) could be sensed, and limiter 86 could be replaced with a switch that would pass or block the signal $v_{emc}$ based upon a threshold voltage to which the magnitude of the load voltage is compared. The ideal limiter level is set according to $\pm$rect $[((V_{A1\_limit}/g_{A1}-|V_{i1}|)/K_{R1}]$ where rect( ) is a rectifier function, returning its argument when the argument is greater zero, and returning zero for all other values. For both trapezoidal and sinusoid gradient waveforms, the effective voltage delivered to load 14 is not reduced as a result of EMC 62 using the variable limiter circuit. Accordingly, the ideal peak voltage is achieved.

Limiter 86 clips instead of amplifier module 12. With a zero-sum injection of the control signal $v_{emc}$, this perturbation does not appear at load 14. In practical terms, however, the added harmonic spectrum of the control signal $v_{emc}$ could produce non-zero-sum injection errors to load 14 if $K_{R1}G_{A1}=K_{R2}G_{A2}$ is not satisfied over the full frequency spectrum of $v_{emc}$. The following EMC implementation avoids both problems of headroom reduction and added harmonics.

Figure 19:
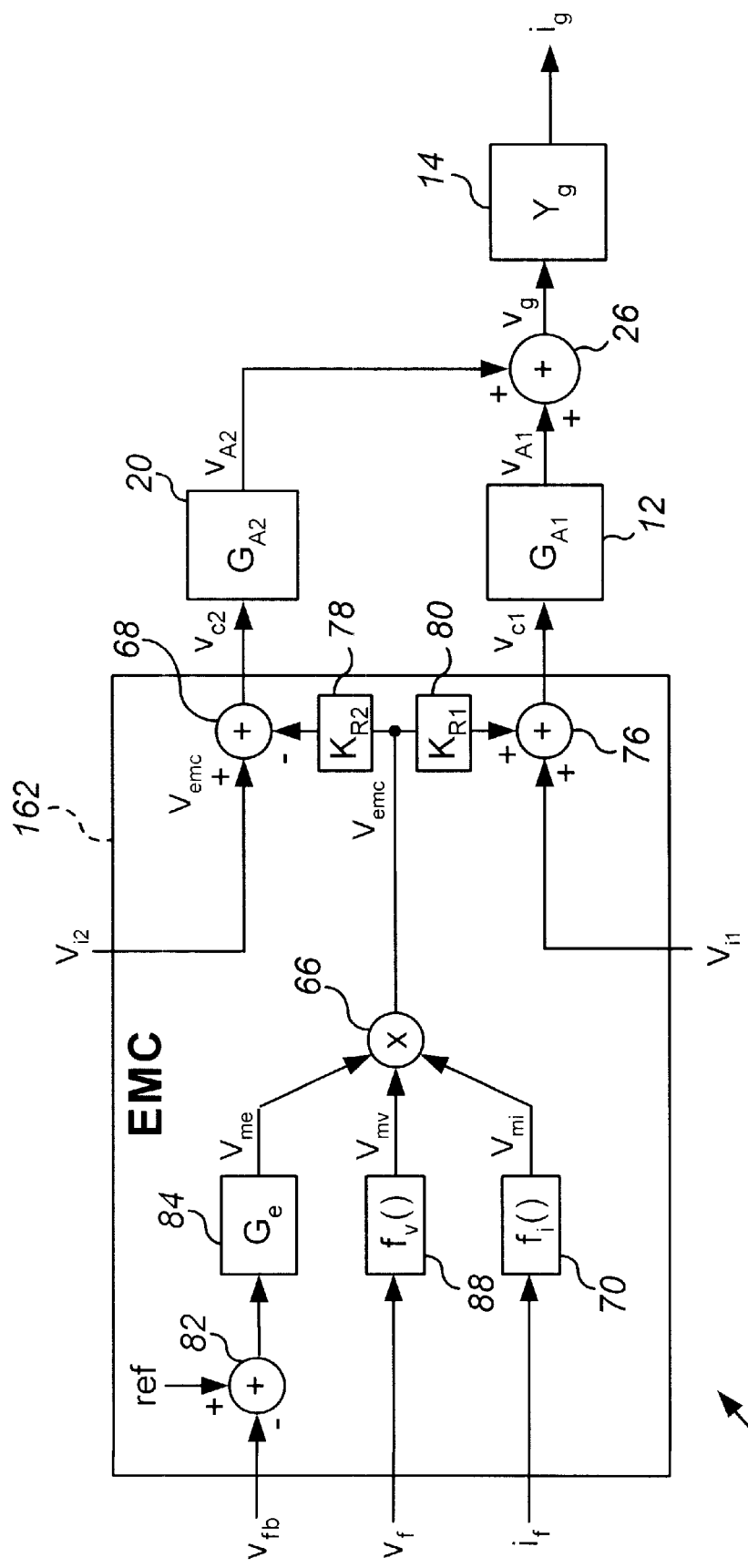
FIG. 19 is a block diagram of the EMC of FIG. 18 with a voltage dependent attenuator circuit.

EMC 162 of FIG. 19 includes a third input to EMC multiplier 66 which is derived from passing a voltage signal $v_f$ through the non-linear function $f_v(\ )$ of block 88. EMC 162 is distinct from that of FIG. 18 in that voltage-fed EMC 62 of FIG. 18 does not directly limit the control signal $v_{emc}$, but rather attenuates it according to the output of $f_v(v_f)$. The voltage signal $v_f$ continuously attenuates the control signal $v_{emc}$, thereby eliminating the distinct module operation of limiter 86 (i.e., clip vs. no-clip). The preferred signal to be used as $v_f$ is the input signal $v_{i1}$ or its equivalent, although other signals may also be used (e.g., $i_g Y_g$, $v_g$, $i_d Y_g$, etc.). Assuming $v_f=v_{i1}$, the function $f_v(v_f)$ is of the same form as that used to determine the clip level for limiter 86 wherein $\pm$rect $[((V_{A1\_limit}/g_{A1})-|V_{i1}|)/K_{R1}]$. It should be noted that, since output $v_{mv}$ of $f_v(\ )$ is multiplied by $v_{mi}$ and $v_{me}$, it is still possible to drive amplifier module 12 into clip if either signal is too large. If system 24 is designed properly, however, this will not occur when operating within the system's RMS and peak current ratings. When the voltage of load 14 is at its theoretical maximum, the signals $v_{A1}$ and $v_{A2}$ coincide (where the gain of amplifier module 12 is the same as the gain of amplifier module 20) since $v_{mv}$ is equal to zero. When the voltage of load 14 is zero, $v_{emc}$ is at its maximum value, and the output signals $v_{A1}$ and $v_{A2}$ are maximally divergent. With an inductive load 14, this is also the point where the current of load 14 is at its maximum.

Figure 20:
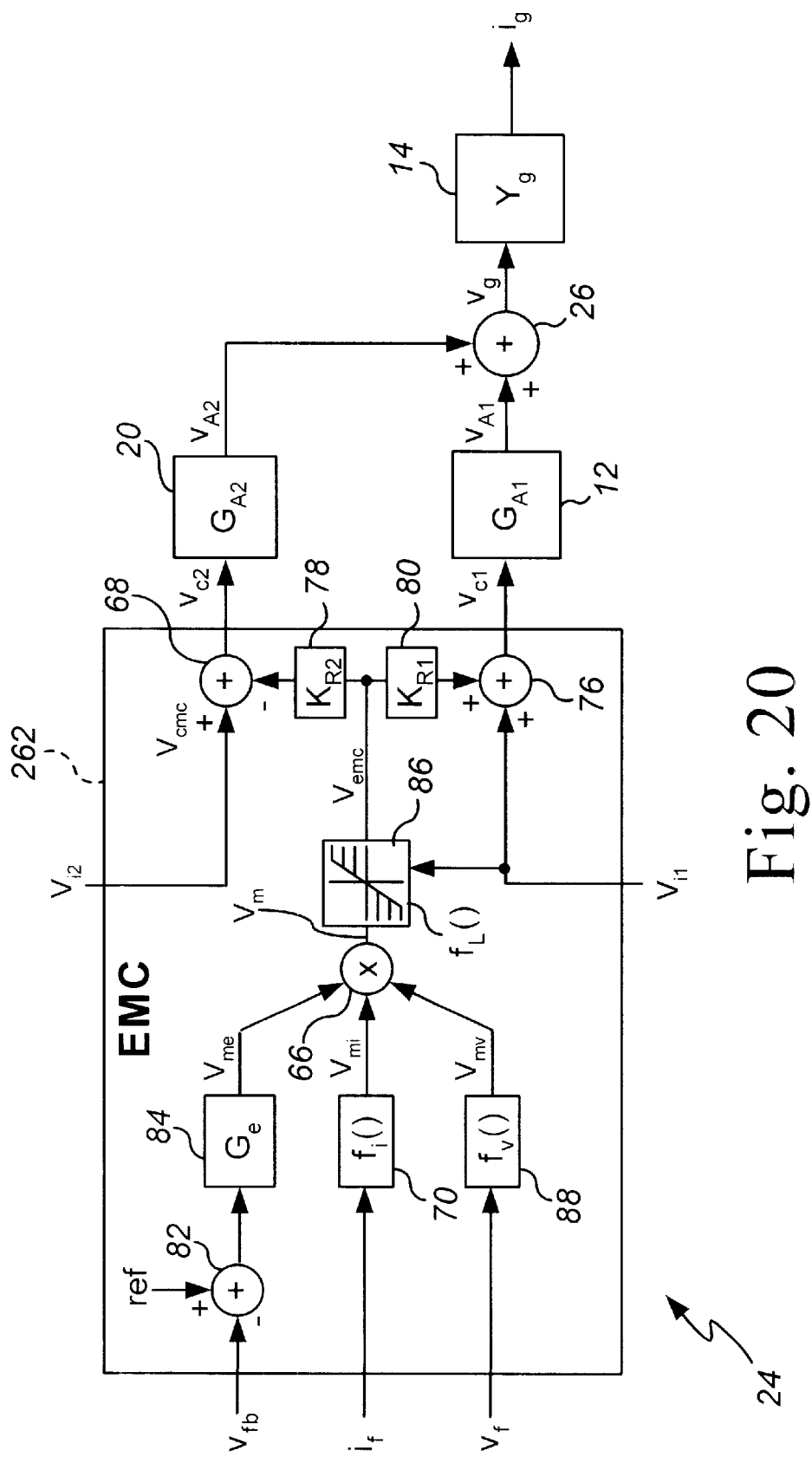
FIG. 20 is a block diagram of the EMC of FIG. 18 with the variable limiter circuit of FIG. 21 and the voltage dependent attenuator circuit of FIG. 19 incorporated.

A generalized EMC 262 is depicted in FIG. 20, where both types of voltage dependencies are included: the attenuator type using $f_v(v_f)$, and the limiter type using $f_L(v_m)$. EMC 262 generally includes a feedback regulator that monitors a feedback signal $v_{fb}$, and ensures that sufficient power is being delivered to amplifier module 20, and an input signal $i_f$ having the form of load 14 current to properly polarize the feedback regulator output signal to ensure a power flow direction which drives the feedback signal $v_{fb}$ toward the ref signal. Input signal $i_f$ may also be processed in a non-linear fashion and used to alter the magnitude of the regulator output. EMC 262 further includes a zero-sum injection of the altered regulator output signal into the forward path of each amplifier module 12, 20 such that the net signal produced at load 14 due to the polarized regulator output is zero, and an attenuator or attenuation function which further adjusts the magnitude of the regulator output signal, either through attenuation (block 88) or direct limiting (block 86), to prevent the amplifier modules from saturating due to EMC 262.

The feedback input $v_{fb}$ to the regulator may be a signal related to the rail-to-rail voltage of amplifier module 20. Alternatively, the power supply current to amplifier module 20 or the power supply current plus the capacitor current could be used as feedback input $v_{fb}$.

Although non-zero-sum injection of the EMC control signal has drawbacks, such a configuration may have usefulness under certain circumstances. One way in which a non-zero-sum injection method can be employed without producing perturbations in the outer current loop causing errors is where $v_{emc}$ is linearly related to the states in the main current loop. A typical implementation might be a linear-current-fed EMC 262 of FIG. 20 in which the regulator is either eliminated, or its output is compensated for in the main current feedback loop. If no regulator is present, then dynamic energy management is eliminated, and it remains a matter of programming the proper output resistance ΔR either via VMC 44 or the EMC 262.

As should be apparent to one skilled in the art, zero-sum injection may be provided without the appearance of zero-sum injection. Assume ΔR, the real portion of the output impedance of amplifier module 20 is programmed by VMC 44 to be negative such that sufficient power is delivered to amplifier module 20 to overcome both internal losses and the portion of the real load impedance that amplifier module 20 is supporting. To dynamically adjust this net power flow, the real portion of the current error amplifier output $Re[v_c]$ (the portion that supports $R_g$, the resistance of load 14) may be split in varying proportions between both amplifier modules 12, 20, the sum always equaling the total signal required by $R_g$. If too much power is being delivered to amplifier module 20, then a larger portion of $Re[v_c]$ is applied to amplifier module 20, and a correspondingly smaller portion is applied to amplifier module 12. Thus, amplifier module 20 delivers more net power to load 14, reducing the power that would otherwise be made available for replenishing the input capacitors to amplifier module 20.

This type of signal flow is no different from zero-sum injection. Instead of splitting $Re[v_c]$ in unequal portions, it is simply split in an equal portion as the imaginary term, and in its place could be added two summing nodes, one in the forward path of amplifier module 12, and the other in the forward path of amplifier module 20. Then, a signal that was in proportion to the current of load 14 (or demand current $i_d$) could be added to the summing node of amplifier module 12 and subtracted from the summing node of amplifier module 20. By dynamically attenuating this signal, the portion of the load signal required for driving $R_g$ could be decreased in amplifier module 20 and equally increased in amplifier module 12. This is no different from the linear-fed EMC 262 added to a VMC which effectively included a negative current feedback or feed-forward signal to amplifier module 20.

In general, any number of amplifier modules 12, 20 may be connected in series. Each FAM requires a separate EMC 62. EMC 62 control signal $v_{emc}$ from each FAM is also summed with the input to the GAM (i.e., the amplifier powering the FAMs). If there is more than one GAM, then the zero-sum injection of each $v_{emc}$ signal may be accomplished via any combination of GAMs. A typical configuration of a GAM and two FAMs is shown in FIGS. 21 and 22.

Figure 22:
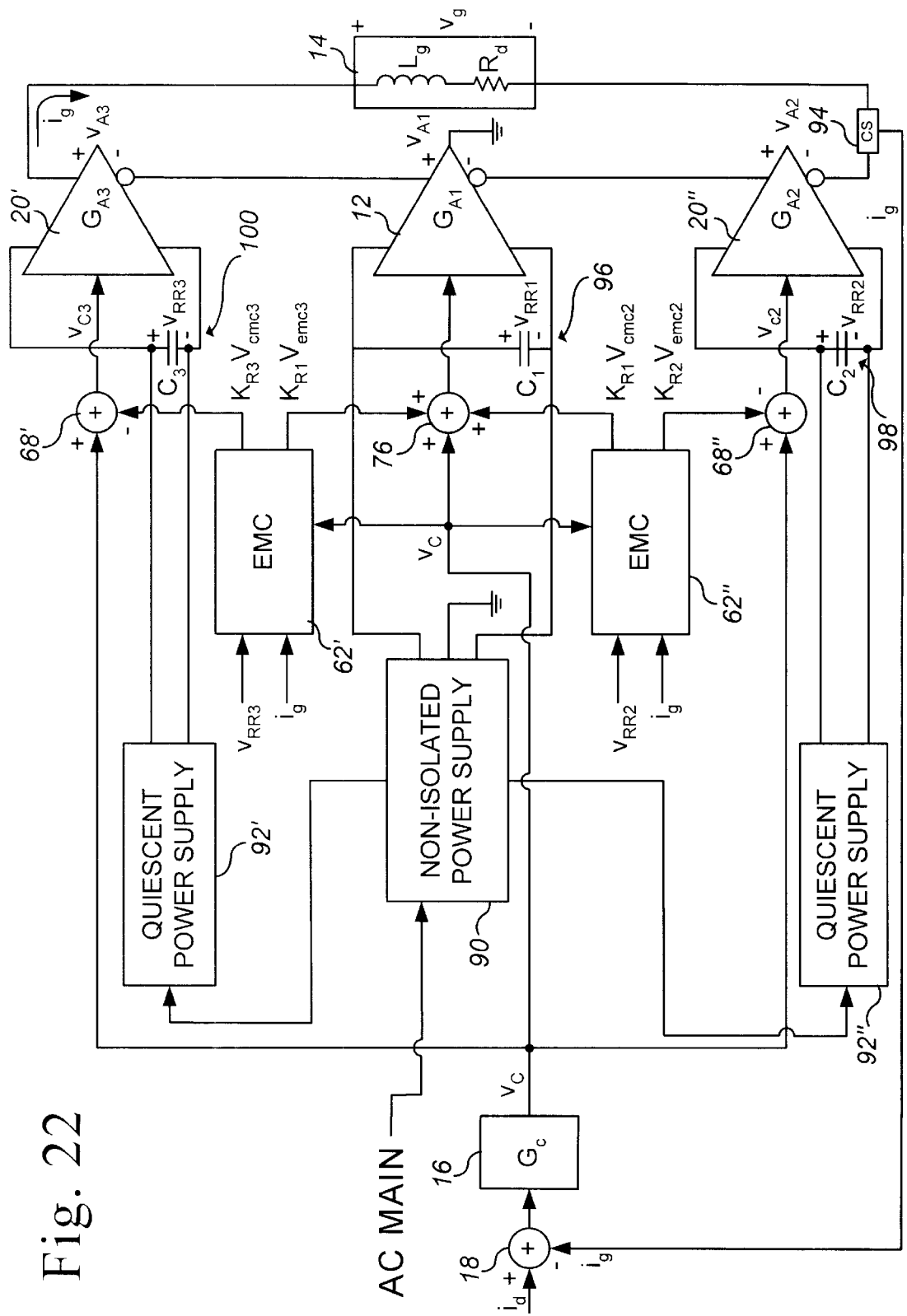
FIG. 22 is another block diagram of the system of FIG. 21.

Referring to FIG. 22, main power supply 90 may be non-isolated, and powers GAM 12. The two FAMs 20', 20" are powered by their respective quiescent power supplies 92', 92". The input to quiescent supplies 92', 92" could be any number of sources, including the AC mains or the DC output of main power supply 90. Supplies 92', 92" could be either isolated or "boot strapped." FIG. 22 also shows a current sensing device 94, as well as the energy storage capacitors 96, 98, 100. Load 14 is depicted as being inductive and resistive, which is the case for a MRI application. In general, however, this invention could be applied to systems 24 that have an arbitrary load (e.g., a capacitor, a motor with mechanical energy storage, a resistor, etc.).

Figure 21:
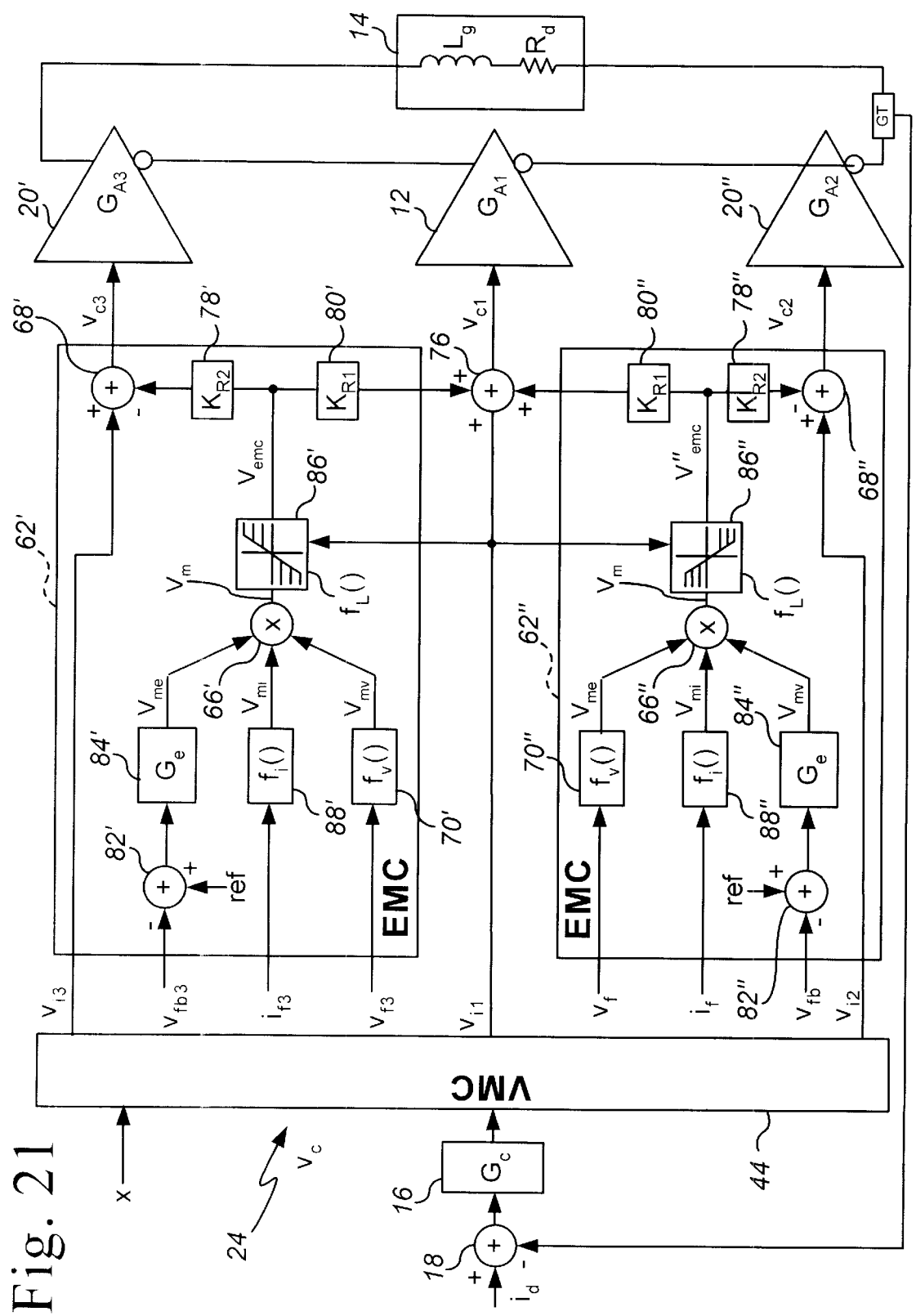
FIG. 21 is a block diagram of a three-amplifier module system having two EMCs, two FAMs, and one GAM.
Figure 23:
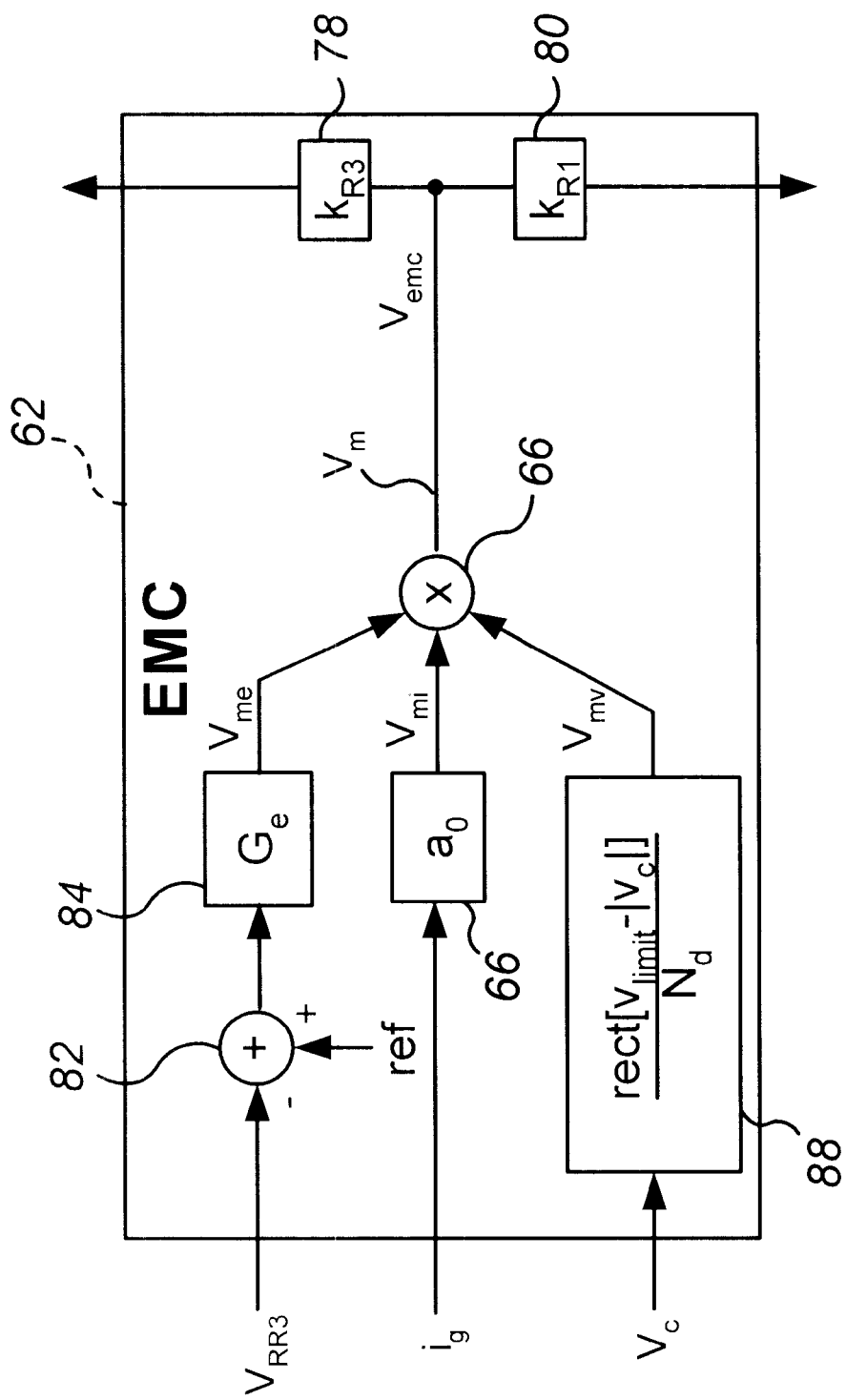
FIGS. 23 and 24 are block diagrams of embodiments of EMCs for use in the system of FIG. 22.
Figure 24:
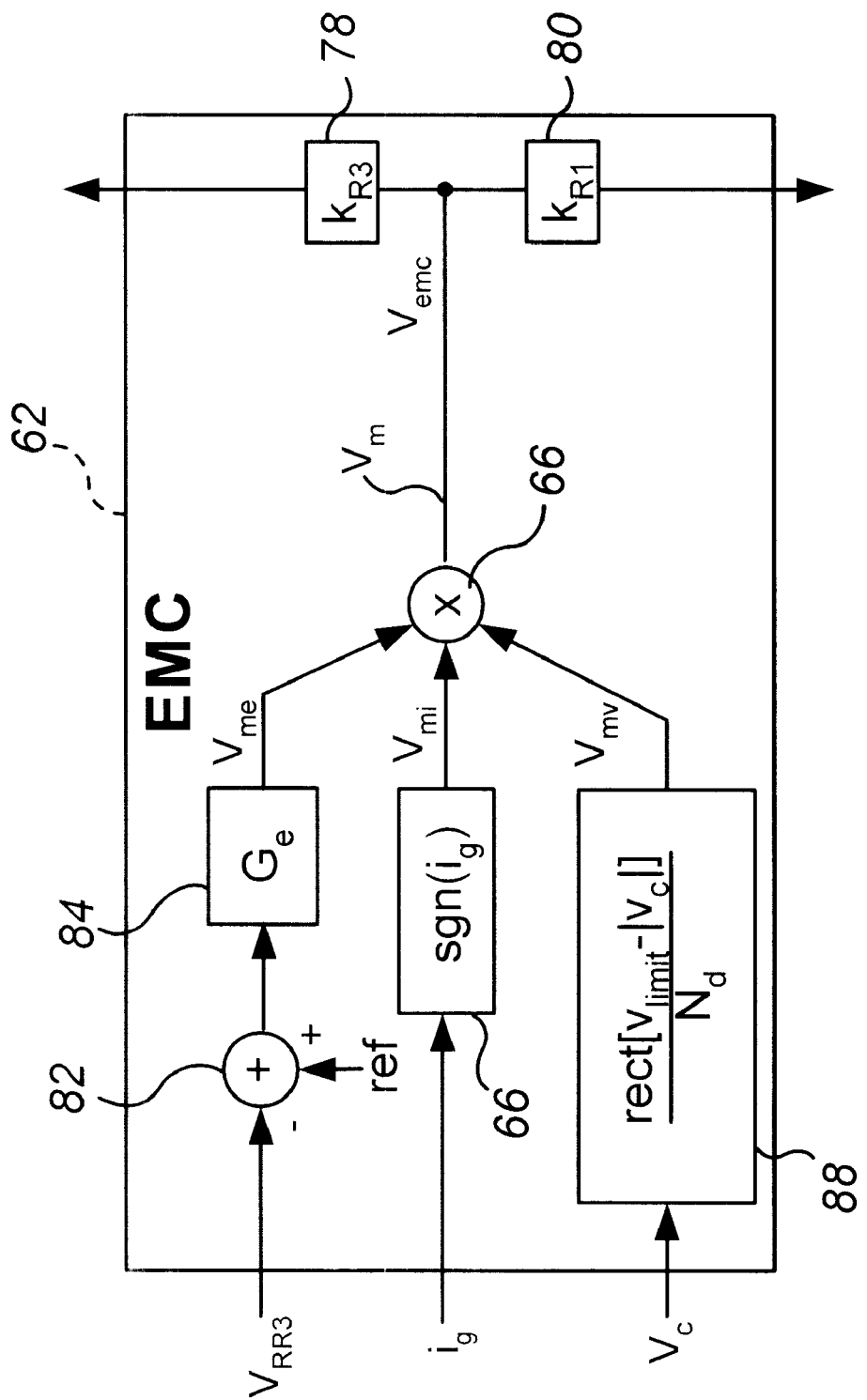

FIGS. 23 and 24 show two embodiments of EMCs 62', 62" of FIGS. 21 and 22. Both embodiments use voltage limiting block 88 having a transfer function $f_v(v_c)$ as described in conjunction with FIG. 19. EMC 62 control signal $v_{emc}$ is effectively attenuated based upon the available headroom present in GAM 12. Because GAM 12 supports EMC 62 activity from two FAMs 20', 20", block 88 includes a product of $1/N_d$, where $N_d$ is the number of FAMs. If FAMs 20', 20" dissipate roughly the same amount of power, then GAM 12 will not clip as a result of either EMC 62', 62". If FAMs 20', 20" have significantly different power dissipations, then the available headroom of GAM 12 may be determined by defining $f_v()$ in EMC 62 of one of FAMs 20', 20", for example, $f_{v3}()$, to equal $f_{v3}(v_c, v_{emc2}) = \text{rect}(v_{limit} - |v_c + K_{R2}v_{emc2}|)$ while $f_{v2}()$ of the other FAM 20" is defined in a form as described in conjunction with FIG. 19. In other words, the signal $v_{mv}$ of EMC 62' for FAM 20' would be determined by not simply looking at current error signal $v_c$, but the additional signal that will be demanded of GAM 12 due to $v''_{emc}$, the EMC control signal of FAM 20". Additionally, $k_{R1}$, $k_{R2}$, and $k_{R3}$ should be chosen to ensure zero-sum injection of the EMC control signals. Although none of the amplifier modules 12, 20', 20" need to be identical (or even similar), the preferred embodiment would make use of identical modules.

Finally, a variety of implementations for voltage regulation of the individual amplifier modules 12, 20', 20" result in a workable system 24. One is to employ a voltage regulating loop around each amplifier module 12, 20', 20". Alternatively, one regulating loop may encompass the entire series connection of amplifier modules. One benefit of a single regulating loop is a higher achievable bandwidth by interleaving the PWM clocks of each amplifier module 12, 20', 20". Finally, it is possible to design system 24 with no voltage-regulating loop. This can be done since PWM-type amplifiers or switched-voltage segment amplifiers are more like voltage sources than current sources. They exhibit fairly low output impedance even without voltage feedback.

What is claimed is:

1. An amplifier system for driving a load, including:
   first and second amplifier modules, each having a signal output connected in series with the load for providing output power to the load; and
   a controller receiving a feedback signal indicative of a stored energy associated with the second amplifier module, and outputting a control signal to the amplifier modules responsive to the feedback signal to decrease the second amplifier module output power and increase the first amplifier module output power.

2. The system of claim 1 wherein the feedback signal is indicative of a power associated with the second amplifier module.

3. The system of claim 1 wherein the output power of the first and second amplifier modules results in a net power to the load, the net power at the load being substantially unchanged by the control signal.

4. The system of claim 1 further including first and second power supplies for providing power to the first and second amplifier module power inputs, respectively.

5. The system of claim 1 wherein each of the first and second amplifier modules includes a signal input for receiving the control signal.

6. The system of claim 1 wherein the first amplifier module output power includes an average power and the second amplifier module output power includes an average power, the first amplifier module average output power being greater than the second amplifier module average output power.

7. The system of claim 1 wherein the second amplifier module output power decrease is substantially equal in magnitude to the first amplifier module output power increase.

8. The system of claim 1 wherein the controller receives a current signal representative of a current at the load.

9. The system of claim 1 wherein the controller receives a reference signal, the feedback signal being compared to the reference signal to produce a voltage error signal.

10. The system of claim 9 wherein the controller includes an amplifier for receiving the voltage error signal, the amplifier outputting the control signal.

11. The system of claim 8 wherein the current signal is proportional to the load current.

12. The system of claim 8 wherein the current signal has a polarity which is the same as a polarity of the load current.

13. The system of claim 8 wherein the controller includes a current shaping function for receiving the current signal, the current shaping function having an output which attenuates the control signal in response to the current signal.

14. The system of claim 13 wherein the current shaping function output has a polarity which is the same as a polarity of the current signal.

15. The system of claim 1 wherein the controller includes an attenuator for attenuating the control signal, the attenuator being controlled by a voltage signal.

16. The system of claim 15 wherein the control signal is representative of a load voltage.

17. The system of claim 16 wherein the control signal is zero when the voltage signal equals a predetermined amplitude.

18. The system of claim 16 wherein the control signal has a first polarity when the voltage signal is less than a predetermined amplitude, and a second polarity when the voltage signal is greater than the predetermined amplitude.

19. The system of claim 16 wherein the control signal has a maximum amplitude when the voltage signal is zero.

20. The system of claim 1 wherein the control signal has an amplitude and the controller includes a limiter for limiting the control signal amplitude to a limit.

21. The system of claim 20 wherein the controller receives a voltage signal for controlling the limit.

22. The system of claim 21 wherein the limit has a maximum value when the voltage signal is zero.

23. The system of claim 20 wherein the limit is zero when the voltage signal is greater than a predetermined amplitude.

24. The system of claim 1 wherein the second amplifier module includes a plurality of amplifiers.

25. The system of claim 1 wherein the first amplifier module includes a first plurality of amplifiers, and the second amplifier module includes a second plurality of amplifiers.

26. An amplifier system for driving an inductive load, including:
first and second amplifier modules having outputs connected in series with the load for providing output power to the load, the first amplifier module having a power input for receiving input power, and a signal input, the second amplifier module having a power input for receiving input power, and a signal input; and
a controller having a feedback signal input for monitoring the second amplifier module input power, and an output for providing a control signal to the first and second amplifier module signal inputs in response to a condition of the second amplifier module input power, the control signal decreasing the second amplifier module output power and increasing the first amplifier module output power such that the first amplifier module provides output power lo the second amplifier module.

27. The system of claim 26 wherein the first and second amplifier module output power combine at the load to define a net load power, the net load power remaining substantially unchanged as a result of the decrease in second amplifier module output power and the increase in first amplifier module output power.

28. The system of claim 26 wherein the first amplifier module output power includes an average power and the second amplifier module output power includes an average power, the first amplifier module average output power being greater than the second amplifier module average output power.

29. The system of claim 26 wherein the controller receives a current signal representing a current at the load.

30. The system of claim 29 wherein the controller receives a reference signal, the feedback signal being compared to the reference signal to produce a voltage error signal.

31. The system of claim 29 wherein the controller includes a current shaping function for receiving the current signal, the current shaping function having an output which attenuates the control signal.

32. The system of claim 26 wherein the controller includes an attenuator for attenuating the control signal, the attenuator being controlled by a voltage signal.

33. The system of claim 26 wherein the controller includes a limiter for limiting the control signal to a limit.

34. The system of claim 33 wherein the controller receives a voltage signal for controlling the limit.

35. The system of claim 26 wherein the second amplifier module includes a plurality of amplifiers.

36. The system of claim 26 wherein the first amplifier module includes a first plurality of amplifiers, and the second amplifier module includes a second plurality of amplifiers.

37. The system of claim 26 wherein the input power is provided to the first amplifier module by a ground-referenced, non-isolated power supply.

38. The system of claim 26 wherein the input power is provided to the second amplifier module by a second power supply rated to provide a maximum input power to the second amplifier module which is substantially equal to internal quiescent losses of the second amplifier module.

39. A gradient amplifier system for driving a gradient coil in a magnetic resonance imaging system, the gradient amplifier system including:
a ground-referenced amplifier module for providing an first output voltage across the coil;
a floating amplifier module connected in series with the ground-referenced amplifier module and the load for providing a second output voltage across the coil, the first and second output voltages resulting in a net coil voltage, the floating amplifier module having a stored energy; and
a controller coupled to the amplifier modules, the controller receiving a feedback signal indicative of the floating amplifier module stored energy, the controller responding to a feedback signal indicating low floating amplifier module stored energy by outputting a control signal to the ground-referenced amplifier module to increase the first output voltage and to the floating amplifier module to decrease the second output voltage by a substantially equal amount, thereby transferring power from the ground-referenced amplifier module to the floating amplifier module while maintaining the net coil voltage.

40. An amplifier system for driving a load, including:
first means for powering the load;
second means for powering the load, the first and second powering means being connected in series with the load to provide a net power to the load;
means for controlling the first and second powering means, the controlling means outputting a control signal to the first and second powering means responsive to a signal indicating an energy associated with the second powering means, the control signal changing the output power of the first and second powering means such that the energy associated with the second powering means is increased and the net power at the load is substantially unchanged.

* * * * *